US008755556B2

(12) United States Patent
Cohen et al.

(10) Patent No.: US 8,755,556 B2
(45) Date of Patent: Jun. 17, 2014

(54) ACTUATOR APPARATUS WITH COMB-DRIVE COMPONENT AND METHODS USEFUL FOR MANUFACTURING AND OPERATING SAME

(75) Inventors: Yuval Cohen, Rehovot (IL); Shay Kaplan, Givat Ela (IL); Daniel Lewin, Ramat Hashanon (IL); Alex Sromin, Ashdod (IL); Meir Ben Simon, Givat Ela (IL)

(73) Assignee: Audio Pixels Ltd., Rehovot (IL)

( * ) Notice: Subject to any disclaimer, the term of this patent is extended or adjusted under 35 U.S.C. 154(b) by 573 days.

(21) Appl. No.: 13/122,464

(22) PCT Filed: Oct. 1, 2009

(86) PCT No.: PCT/IL2009/000943
§ 371 (c)(1),
(2), (4) Date: Apr. 4, 2011

(87) PCT Pub. No.: WO2010/038229
PCT Pub. Date: Apr. 8, 2010

(65) Prior Publication Data
US 2011/0182150 A1    Jul. 28, 2011

Related U.S. Application Data

(60) Provisional application No. 61/136,778, filed on Oct. 2, 2008.

(51) Int. Cl.
*H04R 1/00* (2006.01)
(52) U.S. Cl.
USPC .......................................... 381/398; 381/176
(58) Field of Classification Search
USPC .................................. 381/174, 176, 431, 398
See application file for complete search history.

(56) References Cited

U.S. PATENT DOCUMENTS

| 4,173,009 | A  | * | 10/1979 | Toda ............................. 367/164 |
| 6,628,043 | B2 | * | 9/2003  | Furukawa et al. ......... 310/313 R |
| 7,502,486 | B2 | * | 3/2009  | Shin et al. .................... 381/396 |
| 2002/0005976 | A1 | | 1/2002 | Behin et al. |
| 2002/0118850 | A1 | | 8/2002 | Yeh et al. |
| 2006/0145059 | A1 | | 7/2006 | Lee et al. |
| 2007/0128757 | A1 | | 6/2007 | Ko et al. |
| 2007/0165886 | A1 | * | 7/2007 | Topliss et al. ................ 381/152 |
| 2008/0123242 | A1 | | 5/2008 | Zhou |

FOREIGN PATENT DOCUMENTS

WO  WO 2007/135680 A1  11/2007
WO  WO 2007/135681 A1  11/2007

OTHER PUBLICATIONS

Mar. 29, 2010 International Search Report issued in Application No. PCT/IL2009/000943.

* cited by examiner

*Primary Examiner* — Mark Hellner
(74) *Attorney, Agent, or Firm* — Oliff PLC

(57) ABSTRACT

Actuator apparatus comprising at least one moving elements, each comprising comb drive apparatus including at least first and second comb elements at least one of which is free to be in motion in a medium, and a controller controlling the motion responsive to an input signal representing a desired sound.

3 Claims, 31 Drawing Sheets

| Interval | Acceleration |
|---|---|
| $I_1$ | $\bar{a} = 0$ |
| $I_{2a}$ | $\bar{a}(\bar{t}) = -\beta^2 \cos(2\pi\beta\bar{t})$ |
| $I_{2c}$ | $\bar{a} = 0$ |
| $I_{2d}$ | $\bar{a}(\bar{t}) = \beta^2 \cos[\pi\beta(1-2\bar{t})]$ |
| $I_3$ | $\bar{a} = 0$ |
| $I_{4d}$ | $\bar{a}(\bar{t}) = \beta^2 \cos(2\pi\beta\bar{t})$ |
| $I_{4c}$ | $\bar{a} = 0$ |
| $I_{4a}$ | $\bar{a}(\bar{t}) = -\beta^2 \cos(\pi\beta(1-2\bar{t}))$ |

*Fig. 11*

| Interval | Velocity |
|---|---|
| $I_1$ | $\bar{v} = 0$ |
| $I_{2a}$ | $\bar{v}(\bar{t}) = -\beta \sin(2\pi\beta\bar{t})$ |
| $I_{2c}$ | $\bar{v} = -\beta \sin(2\pi\alpha\beta)$ |
| $I_{2d}$ | $\bar{v}(\bar{t}) = -\beta \sin[\pi\beta(1-2\bar{t})]$ |
| $I_3$ | $\bar{v} = 0$ |
| $I_{4d}$ | $\bar{v}(\bar{t}) = \beta \sin(2\pi\beta\bar{t})$ |
| $I_{4c}$ | $\bar{v} = \beta \sin(2\pi\alpha\beta)$ |
| $I_{4a}$ | $\bar{v}(\bar{t}) = \beta \sin(\pi\beta(1-2\bar{t}))$ |

*Fig. 12*

| Interval | Displacement |
|---|---|
| $I_1$ | $\bar{x} = 1$ |
| $I_{2a}$ | $\bar{x}(\bar{t}) = \cos(2\pi\beta\bar{t})$ |
| $I_{2c}$ | $\bar{x}(\bar{t}) = \cos(2\pi\alpha\beta) - 2\pi\beta(\bar{t} - \alpha)\sin(2\pi\alpha\beta)$ |
| $I_{2d}$ | $\bar{x}(\bar{t}) = 2\cos(2\pi\alpha\beta) - \pi\beta(1 - 4\alpha)\sin(2\pi\alpha\beta) - \cos(\pi\beta(1 - 2\bar{t}))$ |
| $I_3$ | $\bar{x} = 2\cos(2\pi\alpha\beta) - \pi\beta(1 - 4\alpha)\sin(2\pi\alpha\beta) - 1$ |
| $I_{4d}$ | $\bar{x}(\bar{t}) = 2\cos(2\pi\alpha\beta) - \pi\beta(1 - 4\alpha)\sin(2\pi\alpha\beta) - \cos(2\pi\beta\bar{t})$ |
| $I_{4c}$ | $\bar{x}(\bar{t}) = \cos(\pi\beta(1 - 2\bar{t}))$ |
| $I_{4a}$ | $\bar{x}(\bar{t}) = \cos(2\pi\alpha\beta) - \pi\beta(1 - 2(\bar{t} + \alpha))\sin(2\pi\alpha\beta)$ |

| | |
|---|---|
| $X_m$ | $x_m = U_{ret}^2 \dfrac{k_{border}\varepsilon_0 L}{\delta m \omega_0^2}$ |
| $S$ | $\bar{S} = 2 - 2\cos(2\pi\alpha\beta) + \pi\beta(1 - 4\alpha)\sin(2\pi\alpha\beta) =$ $2\sin(\pi\alpha\beta)(2\sin(\pi\alpha\beta) + \pi\beta(1 - 4\alpha)\cos(\pi\alpha\beta))$ |

*Fig. 13*

| Interval | Electrostatic force |
|---|---|
| $I_1$ | $\overline{F} = \beta^2$ |
| $I_{2a}$ | $\overline{F} = 0$ |
| $I_{2c}$ | $\overline{F}(\bar{t}) = \beta^2 (\cos(2\pi\alpha\beta) - 2\pi\beta(\bar{t}-\alpha)\sin(2\pi\alpha\beta))$ |
| $I_{2d}$ | $\overline{F} = \beta^2 [2\cos(2\pi\alpha\beta) - \pi\beta(1-4\alpha)\sin(2\pi\alpha\beta)]$ |
| $I_3$ | $\overline{F} = \beta^2 [2\cos(2\pi\alpha\beta) - \pi\beta(1-4\alpha)\sin(2\pi\alpha\beta) - 1]$ |
| $I_{4d}$ | $\overline{F} = \beta^2 [2\cos(2\pi\alpha\beta) - \pi\beta(1-4\alpha)\sin(2\pi\alpha\beta)]$ |
| $I_{4c}$ | $\overline{F}(\bar{t}) = \beta^2 [\cos(2\pi\alpha\beta) - \pi\beta(1-2(\bar{t}+\alpha))\sin(2\pi\alpha\beta)]$ |
| $I_{4a}$ | $\overline{F} = 0$ |

*Fig. 14A*

| Interval | Voltage to apply |
|---|---|
| $I_1$ | $\overline{U} = \beta$ |
| $I_{2a}$ | $\overline{U} = 0$ |
| $I_{2c}$ | $\overline{U}(\bar{t}) = \beta\sqrt{\cos(2\pi\alpha\beta) - 2\pi\beta(\bar{t}-\alpha)\sin(2\pi\alpha\beta)}$ |
| $I_{2d}$ | $\overline{U} = \beta\sqrt{2\cos(2\pi\alpha\beta) - \pi\beta(1-4\alpha)\sin(2\pi\alpha\beta)}$ |
| $I_3$ | $\overline{U} = \beta\sqrt{2\cos(2\pi\alpha\beta) - \pi\beta(1-4\alpha)\sin(2\pi\alpha\beta) - 1}$ |
| $I_{4d}$ | $\overline{U} = \beta\sqrt{2\cos(2\pi\alpha\beta) - \pi\beta(1-4\alpha)\sin(2\pi\alpha\beta)}$ |
| $I_{4c}$ | $\overline{U}(\bar{t}) = \beta\sqrt{\cos(2\pi\alpha\beta) - \pi\beta(1-2(\bar{t}+\alpha))\sin(2\pi\alpha\beta)}$ |
| $I_{4a}$ | $\overline{U} = 0$ |

*Fig. 14B*

| | |
|---|---|
| $\omega_0$ | Natural circular frequency (rad/s) of comb element 10 |
| $f_0$ | Natural cyclic frequency (Hz) of comb element 10; equal to $2\pi\omega_0$ |
| $T_s$ | Sampling period of sound to be reproduced by apparatus of the present invention; equal to 2 of interval I2 or I4 (e.g. in Fig. 12) |
| $f_s$ | Sampling frequency of sound to be reproduced by apparatus of the present invention. Equal to $1/T_s$ |
| $t_{ac/dec}$ | Duration of acceleration/deceleration of comb element 10 as it moves between its 2 extreme positions; equal to length of interval I2a or I2d or I4d or I4a (e.g. in Fig. 10) |
| m | Mass of an individual comb element 10 |
| t | Time elapsed from beginning of a motion interval |
| $\bar{t}$ | Relative time elapsed from beginning of a motion interval; equal to $t/T_s$ |
| $x(\bar{t})$ | Displacement of comb element 10; equal to position of comb element 10 relative to its equilibrium point |
| $v(\bar{t})$ | Velocity of comb element 10 at time $\bar{t}$ |
| $a(\bar{t})$ | Acceleration of comb element 10 at time $\bar{t}$ |
| $F(\bar{t})$ | Electrostatic force 10 affected on comb element 10 at time $\bar{t}$ |
| $U(\bar{t})$ | Voltage applied between comb elements 10 and 20 at time $\bar{t}$ |
| $x_{max}$ | Maximal value of $x(\bar{t})$ |
| S | Stroke; equal to difference between maximal and minimal values of $x(\bar{t})$ |

Fig. 15A

| | |
|---|---|
| $U_{ret}$ | Voltage which when applied between comb elements 10 and 20 results in a displacement $x_{max}$ of the comb element 10 |
| $\delta$ | Distance between interlaced teeth of comb elements 10 and 20 |
| $L$ | Active perimeter; equal to portion of the total notched perimeter of the comb element 10 which is interlaced with a corresponding portion of the notched perimeter of comb element 20; typically, the sum of perimeters of each tooth of comb element 10 which is interlaced with teeth of comb element 20 |
| $k_{border}$ | The magnitude of the border effect (also known as fringe effect) of the electric field between comb elements 10 and 20 as computed by conventional 3D finite element analysis electrostatic simulation tools. |
| $\varepsilon_0$ | Vacuum permittivity constant |
| $\varepsilon_m$ | Relative permittivity of the medium in which the apparatus is disposed |
| $\bar{x}(\bar{t})$ | $x(\bar{t})/x_{max}$ |
| $\bar{s}$ | $S/x_{max}$ |
| $\bar{v}(\bar{t})$ | $v(\bar{t})/(x_{max}\omega)$ |
| $\bar{a}(\bar{t})$ | $a(\bar{t})/(x_{max}\omega^2)$ |
| $\bar{F}(\bar{t})$ | $F(\bar{t})/(mx_{max}\omega^2)$ |
| $\beta$ | $f_0/f_s$ |
| $\bar{U}(\bar{t})$ | $U(\bar{t})\sqrt{(k_{border}L\varepsilon_0)/(\delta x_{max}\omega^2)}$ |
| $\alpha$ | $t_{ac/dec}/T_s$ |

*Fig. 15B*

ACTUATOR APPARATUS WITH COMB-DRIVE COMPONENT AND METHODS USEFUL FOR MANUFACTURING AND OPERATING SAME

REFERENCE TO CO-PENDING APPLICATIONS

Reference is hereby made to the following co-pending applications: PCT/IL2007/000622 filed 21 May 2007 and entitled "Apparatus and methods for generating pressure waves"; PCT/IL2007/000622 filed 21 May 2007 and entitled "Apparatus for generating pressure and methods of manufacture thereof", PCT/IL2007/000621 filed 21 May 2007 and entitled "Volume control", and PCT/IL2007/000623 filed 21 May 2007 and entitled "Arrays of current bearing elements useful for generating pressure waves"; and PCT/IL2007/000618 filed 21 May 2007 and entitled "Direct digital speaker apparatus having a desired directivity pattern"; and to U.S. provisional application No. 61/136,778, filed 2 Oct. 2009 and entitled "Actuator Apparatus With Comb-Drive Component And Methods Useful For Manufacturing And Operating Same", from which priority is claimed.

FIELD OF THE INVENTION

The present invention relates generally to actuators including devices operative to generate pressure such as but not limited to sonic, ultrasonic, subsonic or other speakers and more particularly to digital sound generators.

BACKGROUND OF THE INVENTION

Many types of audio speakers are known.
Comb drive actuators are known.
The disclosures of all publications and patent documents mentioned in the specification, and of the publications and patent documents cited therein directly or indirectly, are hereby incorporated by reference.

SUMMARY OF THE INVENTION

Certain embodiments of the present invention seek to provide an improved actuator, e.g. digital actuator, comprising comb drive transducers.

The terms "vibrating comb", "vibrating comb element" and "moving comb" are all used herein generally interchangeably to refer to a rotor element in the various embodiments shown and described herein. The terms "moving element", "actuator module" and "actuator element" are all used generally interchangeably herein to refer to an actuator, which may be stand-alone or part of an array, and which may or may not in fact be operative to generate sound, and includes a pair of comb elements at least one of which is capable of motion relative to the other.

There is thus provided, in accordance with at least one embodiment of the present invention, sound generating apparatus comprising at least one moving element, each comprising comb drive apparatus including at least first and second comb elements wherein at least the first comb element is free to be in motion in a medium; and a controller controlling the motion responsive to an input signal representing a desired sound.

The following parameters may be varied by a designer to define desirable performances: Mass "m" of the in-motion (e.g. vibrating) comb element and/or the vibrating comb element's natural frequency $\omega_0$ or its stiffness k in the direction of the desired movement, these parameters being related as follows: $k = m\,\omega_0^2$.

The following control parameters may be selected to suit the application: Maximal displacement $x_{max}$ and/or vibrating movement pattern parameter $\alpha$.

Design and control parameters are typically selected to fulfill one, some or all of the following considerations: to provide sufficient stroke for the demands of the application; to provide clock frequency $f_s$ (also termed herein after sampling rate or sample rate) defining a Nyquist frequency $f_s/2$ sufficiently high to allow reproduction of the frequency range required for the application according to sampling theory, e.g. Nyquist frequency $f_s/2$ is higher than the highest frequency within the desired frequency range; to provide clock frequency $f_s$ sufficiently high to assure the undesirable sound artifacts associated with and produced by digital sound systems as a result of aliasing at frequencies between the Nyquist frequency $f_s/2$ and the clock frequency $f_s$ are minimal and preferably outside the frequency range of the sensor, e.g. in case the application is a speaker for human use, by selecting Nyquist frequency that is ultrasonic i.e. $f_s/2 \geq 20$ KHz or $f_s \geq 40$ KHz; by designing the vibrating comb such that its natural frequency will be about ⅔ of the clock frequency, and such that, subject to that constraint, the vibrating comb's mass is as small as possible (minimal "m") and such that its active perimeter i.e. the combined length of the teeth of the comb is as long as possible; to provide a desirable movement profile i.e. displacement vs. time thus producing desirable pressure vs. time profile; to provide sufficient force to allow achieving the desirable movement profile at time intervals of $T_s/2$, $T_s$ being defined as $1/f_s$; to provide voltage profile to generate the sufficient force defining a maximal required voltage and wherein the maximal required voltage is as low as possible.

Further in accordance with at least one embodiment of the present invention, the controller comprises n control units and the at least one moving element includes n corresponding sets of moving elements, wherein each individual set is in control communication with the control unit corresponding thereto, and is controlled by the control unit corresponding thereto such that all moving elements in the individual set move together.

Still further in accordance with at least one embodiment of the present invention, at least one individual set comprises moving elements connected in parallel via individual electrical connections to the control unit corresponding thereto. The apparatus may or may not also comprise at least one fuse disposed along at least one of the individual electrical connections such that if a moving element is short circuited, the fuse burns out, only the short circuited moving element is disconnected from the control unit and all moving elements other than the short circuited moving element remain connected to the control unit, hence operational.

Additionally in accordance with at least one embodiment of the present invention, the moving elements are partitioned into sets of moving elements and the controller comprises at least one control unit corresponding in number to the sets and wherein each individual control unit collectively controls all moving elements in a set corresponding to the individual control unit.

Still further in accordance with at least one embodiment of the present invention, the first comb element includes at least one flexure suspending the first comb element relative to the second comb element.

Additionally in accordance with at least one embodiment of the present invention, a digital signal is sampled at a sampling frequency defining a sampling interval and wherein, for each individual sampling interval, the digital signal has a sampled value determining a subset of the at least one moving element which is to move during the sampling interval.

Still further in accordance with at least one embodiment of the present invention, each of the at least one moving elements is operative to move back and forth between first and second extreme positions.

Additionally in accordance with at least one embodiment of the present invention, each of the at least one moving elements is operative to move back and forth between first and second extreme positions and wherein, upon termination of the sampling interval, each moving element in the subset is positioned at one of the first and second extreme positions.

Further in accordance with at least one embodiment of the present invention, all of the moving elements in the at least one moving element other than the subset of moving elements remain stationary during the sampling interval.

Still further in accordance with at least one embodiment of the present invention, each of the at least one moving elements has a first fixed velocity pattern vs. time as it moves from the first extreme position to the second extreme position.

Still further in accordance with at least one embodiment of the present invention, each of the at least one moving elements has a second fixed velocity pattern vs. time as it moves from the second extreme position to the first extreme position and each velocity pattern defines a velocity value at each point in time and wherein the velocity values defined by the first and second velocity patterns at each individual point in time are substantially equal in magnitude and opposite in sign.

Additionally in accordance with at least one embodiment of the present invention, each of the at least one moving elements has a first fixed velocity pattern vs. time and wherein the first fixed velocity pattern is symmetrical, along a time axis, relative to a time point bisecting the sampling interval.

Further in accordance with at least one embodiment of the present invention, each individual moving element in the at least one moving element moves at constant velocity during a portion of the sampling interval.

Still further in accordance with at least one embodiment of the present invention, the at least one moving elements have a natural resonance frequency which is substantially $2/3$ of the sampling frequency.

Also provided, in accordance with at least one embodiment of the present invention, is a sound generating method comprising providing at least one moving element, each comprising comb drive apparatus including at least first and second comb elements, at least the first comb element being free to be in motion in a medium; and controlling the motion responsive to an input signal representing a desired sound.

According to certain embodiments, the first and second comb elements together define an active perimeter; the at least one moving elements have dimensions not in excess of dimensions dictated by a actuator apparatus application, and the providing including selecting, for the active perimeter, the maximal value which enables reliable operation of the at least one moving elements.

Further in accordance with at least one embodiment of the present invention, the first and second comb elements have interlaced teeth, the interlaced teeth define an air gap therebetween, and the providing includes selecting, for the air gap, the minimal value which enables reliable operation of the at least one moving element.

Still further in accordance with at least one embodiment of the present invention, the method also comprises providing an insulating layer isolating the first and second comb elements from one another, the layer being formed of an insulating material having a breakdown voltage, the providing of an insulating layer comprising selecting, an insulating material which yields feasibility of the at least one moving element.

Additionally in accordance with at least one embodiment of the present invention, the method also comprises, during operation, applying only voltages not exceeding a maximal voltage level across the first and second comb elements, and wherein the providing also comprises providing an insulating layer isolating the first and second comb elements from one another, the layer being formed of an insulating material having a thickness, the providing of an insulating layer including selecting a minimal thickness for the insulating layer which enables reliable operation of the at least one moving element even at the maximal voltage level.

Further in accordance with at least one embodiment of the present invention, the moving element has a point of equilibrium and wherein the first and second extreme positions respectively comprise a minimally extended position and a maximally extended position and wherein the minimally extended position coincides with the point of equilibrium.

Still further in accordance with at least one embodiment of the present invention, each individual moving element in the at least one moving elements never moves at a constant velocity at any point during the sampling interval.

Also in accordance with at least one embodiment of the present invention, the method also comprises controlling the motion, using a controller, responsive to an input signal representing a desired sound.

Further in accordance with at least one embodiment of the present invention, a natural resonance frequency value is predetermined, and each of the moving elements comprises a spring, and the providing includes selecting a mass and a spring constant for each of the moving elements thereby to achieve the natural resonance frequency for each of the moving elements and to enable reliable operation of the at least one moving element, wherein the spring constant is selected to be minimal and the mass is determined by the natural resonance frequency and the spring constant.

Still further in accordance with at least one embodiment of the present invention, the apparatus also comprises a sensor operative to sense at least one parameter indicative of the motion of the first comb element and to supply the parameter to the controller and wherein the controller uses the parameter as feedback in controlling the motion responsive to the input signal.

Additionally in accordance with at least one embodiment of the present invention, the sensor comprises a capacitance sensor measuring a capacitance value indicative of the capacitance between the first and second comb elements.

Further in accordance with at least one embodiment of the present invention, the capacitance sensor directly measures the capacitance between the first and second comb elements.

Additionally in accordance with at least one embodiment of the present invention, the apparatus also comprises at least one third comb element, wherein the first, second and third comb elements respectively comprise first, second and third multiplicities of teeth, and wherein the third multiplicity of teeth is interlaced with at least some of the first multiplicity of teeth; and wherein the capacitance sensor measures capacitance between the first and third comb elements.

Further in accordance with at least one embodiment of the present invention, the controller controls the motion by applying a variable voltage across the first and second comb elements.

Still further in accordance with at least one embodiment of the present invention, the controller controls the motion by applying a sequence of voltage pulses across the first and second comb elements, the voltage pulses having a varying duty cycle.

Additionally in accordance with at least one embodiment of the present invention, the desired sound has a desired volume at each point in time and each of the at least one moving elements is operative to move back and forth between first and second extreme positions defining a traveled distance therebetween, and wherein the traveled distance varies over time in accordance with the desired volume at each point in time.

Further in accordance with at least one embodiment of the present invention, the moving elements are disposed at a fixed distance from one another and the sampling frequency defines a wavelength computed by dividing the velocity of sound by the sampling frequency and wherein the fixed distance is smaller than half of the wavelength.

Still further in accordance with at least one embodiment of the present invention, the at least one moving elements are separated from one another by structural walls having a thickness and wherein the providing includes selecting a minimal thickness for the structural walls which enables reliable operation of the at least one moving elements.

It is appreciated that the total force operating on the moving element, thereby to cause its motion, the total force including mainly controller-applied force and spring force, is typically applied to at least an individual one of the at least one moving elements during a sampling interval having a center-point and is typically, as a function of time, symmetrical about the center-point.

Additionally in accordance with at least one embodiment of the present invention, a sampling frequency is pre-defined and the providing comprises computing a natural resonance frequency for the at least one moving elements based on the sampling frequency, computing a mass and a spring coefficient for the first comb element which achieve the natural resonance frequency, and fabricating comb apparatus having the mass and the spring coefficient to serve as the first comb element.

Further in accordance with at least one embodiment of the present invention, each of the at least one moving elements is operative to move back and forth between first and second extreme positions and wherein the sampling interval comprises an acceleration interval during which each moving element in the subset has a positive acceleration thereby to define $\alpha$=the proportion between the acceleration interval and the sampling interval, and wherein each of the moving elements has a natural resonance frequency thereby to define $\beta$=the proportion between the natural resonance frequency and the sampling frequency, and wherein $2\cos(2\pi\alpha\beta)-\pi\beta(1-4\alpha)\sin(2\pi\alpha\beta)\geq 1$ Still further in accordance with at least one embodiment of the present invention, $2\cos(2\pi\alpha\beta)-\pi\beta(1-4\alpha)\sin(2\pi\alpha\beta)=1$ Additionally in accordance with at least one embodiment of the present invention, the at least one moving element comprises a plurality of moving elements.

Also provided, in accordance with another embodiment of the present invention, is an actuator apparatus comprising at least one moving element, each comprising a comb drive apparatus including a central comb element; a peripheral comb element which is disposed peripherally of the central comb element and which is free to be in motion in a medium; and at least one flexure which is disposed peripherally outward of the peripheral comb element and from which the peripheral comb element is suspended.

Additionally in accordance with at least one embodiment of the present invention, the apparatus is operative to generate sound, the apparatus also comprising a controller controlling the motion responsive to an input signal representing a desired sound.

Still further in accordance with at least one embodiment of the present invention, each of the at least one moving elements has a second fixed velocity pattern vs. time as it moves from the second extreme position to the first extreme position and each velocity pattern defines a velocity value at each point in time and wherein the velocity values defined by the first and second velocity patterns, at least one individual point in time, are opposite in sign but unequal in magnitude.

Additionally in accordance with at least one embodiment of the present invention, the velocity patterns are achieved by using different force vs. time patterns when moving elements move from their first to second extreme positions, as opposed to when the moving elements move from their second to their first extreme positions, the different patterns being selected so as to ensure that displacement of each moving element, as it moves from the first extreme position to the second extreme position, equals the displacement of each moving element, as it moves from the second extreme position to the first extreme position.

Further in accordance with at least one embodiment of the present invention, each moving element, as it moves from the first extreme position to the second extreme position, has a first acceleration pattern, and wherein each moving element, as it moves from the second extreme position to the first extreme position, has a second acceleration pattern which differs from the first acceleration pattern.

Still further in accordance with at least one embodiment of the present invention, each moving element moves from the first extreme position to the second extreme position, thereby defining a first duration of time, and moves from the second extreme position to the first extreme position, thereby defining a second duration of time differing from the first duration of time.

Still further in accordance with at least one embodiment of the present invention, a digital signal is sampled at a sampling frequency defining a sampling interval and wherein the sum of the first and second durations of time equals the sampling interval.

Still further in accordance with at least one embodiment of the present invention, the input signal comprises an analog signal, the apparatus also comprising an analog to digital converter to convert the analog signal to the digital signal.

Further in accordance with at least one embodiment of the present invention, the input signal comprises the digital signal.

Additionally in accordance with at least one embodiment of the present invention, the input signal comprises an analog input signal and a voltage proportional to the analog input signal is applied to at least one of the moving elements.

Further in accordance with at least one embodiment of the present invention, the voltage proportional to the analog input signal is applied to all of the at least one moving elements.

Also provided, in accordance with still another embodiment of the present invention, is an actuation method comprising providing at least one moving element, each comprising a comb drive apparatus including a central comb element and a peripheral comb element which is disposed peripherally of the central comb element and which is free to be in motion in a medium; and providing at least one flexure which is disposed peripherally outward of the peripheral comb element and from which the peripheral comb element is suspended.

The sensor, when not specifically characterized, may for example comprise a position sensor (e.g. of tension or capacitance type), velocity sensor, acceleration sensor or pressure sensor.

The term "active perimeter" refers herein to that portion of the total notched perimeter of a first comb element which is interlaced with a corresponding portion of the notched perimeter of a second comb element with which the first comb element is engaged; typically, the "active perimeter" is the sum of perimeters of each tooth of comb element 10 which is interlaced with teeth of comb element 20.

The terms "loudspeaker", "speaker", or "speaker system" as used herein are intended to include any sound generating apparatus or transducer that converts a signal to sound, including ultra-sonic or sub-sonic sound. Actuators are sometimes, but not always used to present speech, sound and other audio signals and information to listeners.

"Spring" includes an assembly of one or more elements, each of which may include one or more flexures, which recovers its shape after being deformed, compressed, bent, twisted or stretched.

The position that a vibrating comb element assumes, if no electro-static force is applied to it, and once its motion has decayed and its velocity has reached zero, is termed herein the comb element's "equilibrium point".

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention, or a DSP (digital signal processor).

The apparatus of the present invention may include, according to certain embodiments of the invention, an electronic circuit designed to carry out predefined operations e.g. logic and arithmetical operations, such as but not limited to an ASIC (application specific integrated circuit).

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIG. 11 is a table showing example acceleration functions for each of the time intervals and sub-intervals in the graphs of FIG. 10;

FIG. 12 is a table showing example velocity functions for each of the time intervals and sub-intervals in the graphs of FIG. 10;

FIG. 13 is a table showing example displacement functions for each of the time intervals and sub-intervals in the graphs of FIG. 10, as well as expressions for the maximal displacement $X_m$ and stroke S;

FIG. 14A is a table showing example electrostatic force functions for each of the time intervals and sub-intervals in the graphs of FIG. 10;

FIG. 14B is a table showing example voltage functions for each of the time intervals and sub-intervals in the graphs of FIG. 10;

FIGS. 15A-15B, taken together, form a table explaining the notation used in FIGS. 11-14B;

DETAILED DESCRIPTION OF CERTAIN EMBODIMENTS

Figure 1A:
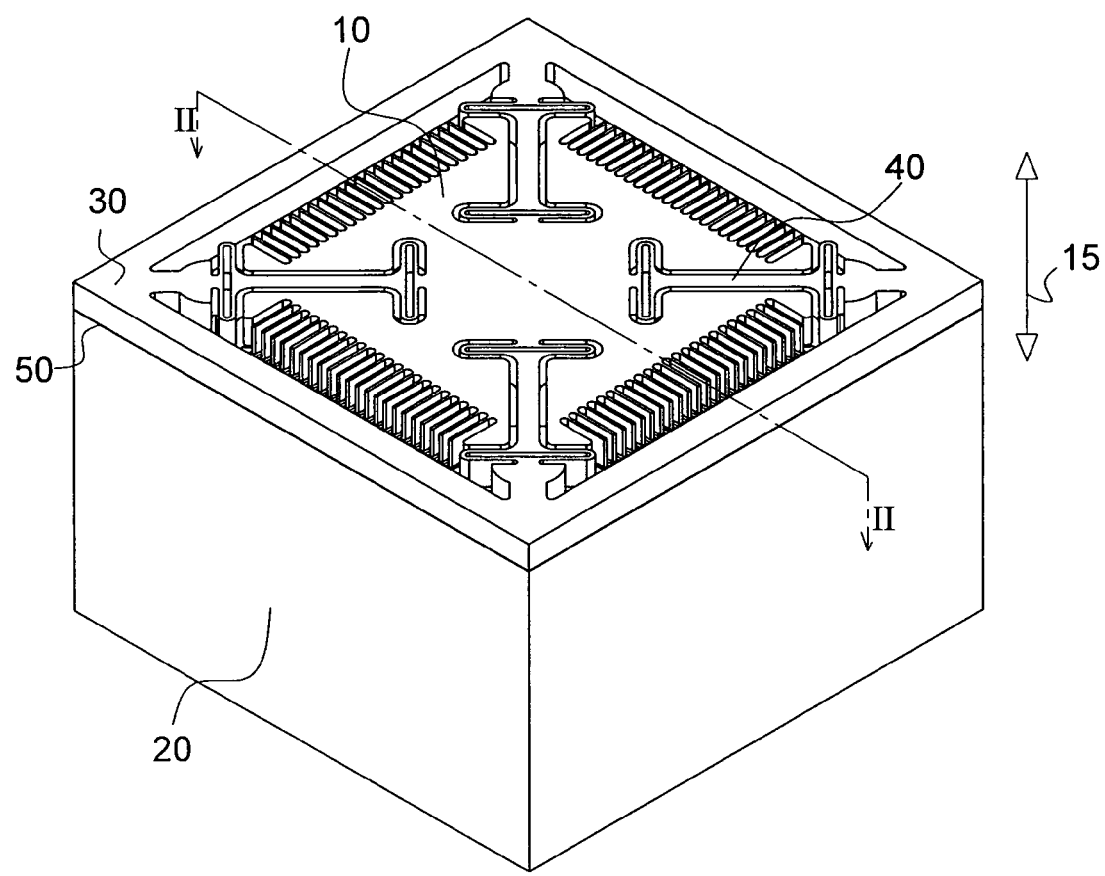
FIG. 1A is an isometric illustration of an actuator module including a comb drive constructed and operative in accordance with certain embodiments of the present invention.
Figure 1B:
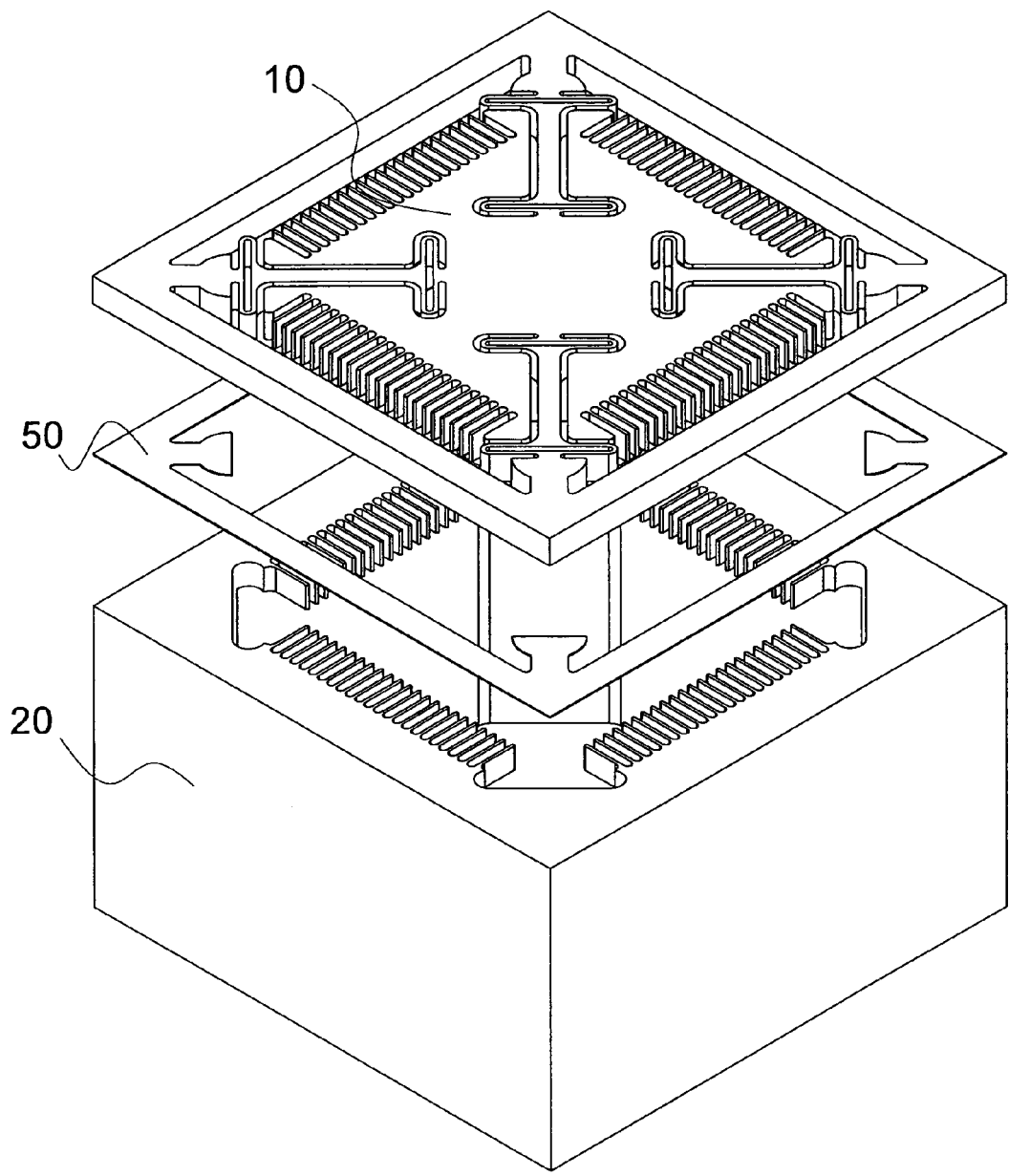
FIG. 1B is an exploded view of the module of FIG. 1A.

FIG. 1A is an isometric illustration of a actuator module including a comb drive comprising a first, moving or vibrating conductive comb element 10 (also termed herein a "rotor") which vibrates back and forth, e.g. up and down, along an axis of vibration 15 and an interlaced second stationary conductive comb element 20 (also termed herein a "static element" or "stator"), both positioned in a medium such as air so as to produce sound. FIG. 1B is an exploded view of the apparatus of FIG. 1A. It is appreciated that, alternatively, both comb elements may move, in opposite directions, rather than one of the comb elements being stationary. The vibrating comb element 10 is connected to a stationary frame 30 via flexure bearings 40 (also termed herein "flexures" or "springs"). The stationary comb element 20 is typically bonded to the frame 30. An insulating or dielectric layer 50 isolates the comb elements 10 and 20 from one another. Any suitable flexure geometry may be employed such as but not limited to beams, cantilevers, trusses, lattices or any combinations thereof. The flexures may be capable of any suitable mode of motion such as bending, twisting, stretching, compressing or any combination thereof which allows movement of the vibrating comb element along its axis of vibration 15. The flexures 40 are typically constructed and operative to prevent or minimize movement which might result in teeth 60 or 70 of FIG. 2 approaching one another such that the gap between teeth, necessary to prevent short circuits, is not maintained. The flexures 40 are typically constructed of an elastic material e.g. silicon or steel having little or no fatigue i.e. that can be repeatedly flexed without changing its mechanical properties and without disintegrating.

It is appreciated that the comb element 10 may have any suitable trajectory of motion, such as the linear vibratory translation of the illustrated embodiment, or any suitable pivotal or other motion. Typically, the motion of the comb has a substantial or exclusive component in a direction perpendicular to a comb plane which is defined by each of the comb elements and which is perpendicular to the plane of the teeth, which are themselves typically planar. If the comb element surface is not planar, the motion of the comb element typically has a substantial or exclusive component in a direction perpendicular to a plane tangential to the surface of each of the comb elements.

According to certain embodiments of the present invention, the rotor 10, the flexures 40 and the frame 30 may all be made of a single sheet of material, also termed herein as "rotor layer".

According to certain embodiments of the present invention, the parameters of the apparatus of FIG. 1 are as per the table of FIGS. 15A-15B, as described in detail below.

Figure 2:
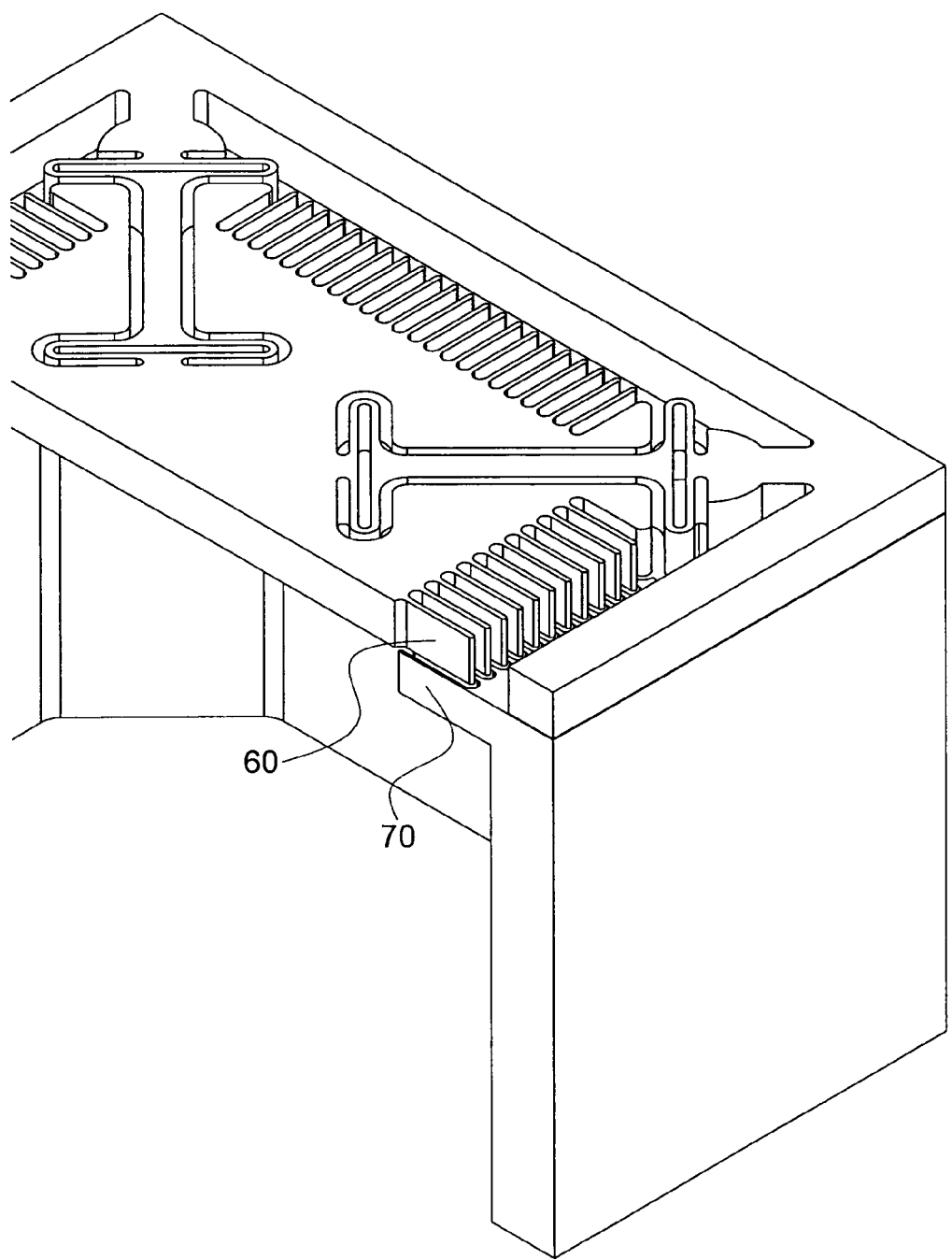
FIG. 2 is a cross-sectional illustration of the module of FIGS. 1A-1B taken along the lines II-II of FIG. 1A.

FIG. 2 is a cross-sectional illustration of the apparatus of FIGS. 1A-1B taken along the lines II-II of FIG. 1A and showing interlacing between the conductive teeth 60 of the first vibrating comb element 10 and the conductive teeth 70 of the second stationary comb element 20. It is appreciated that there is a small gap between adjacent teeth 60 and 70 to prevent short circuits. The gap is typically maintained unchanged, or as close as possible to unchanged, as the vibrating comb element 10 translates along its movement axis 15. The gap may for example be between 0.5-10 microns in width.

The teeth need not be formed of a highly conductive material; for example a semi-conductor material such as silicon may be employed. The dimensions of the teeth are selected to increase the active surface area of the comb drive and on the other hand to provide stiffness sufficient to, insofar as possible, prevent teeth from bending toward one another to an extent that might generate a short circuit between adjacent teeth. Also, the height of the teeth should be such as to ensure a feasible and manufacturable aspect ratio. The term "aspect ratio" refers to the proportion between the width and height of a groove. For example, for silicon teeth, the dimensions might be as follows: between 50-200 microns in length, 3-10 microns wide and the height may be between a few microns and a few dozen microns.

The modules of FIGS. 1A-1B, then, include a pair, or more generally, at least one moving element, each moving element comprising comb drive apparatus including at least first and second comb elements in a medium at least one of which is free to be in motion within the medium, thereby to generate pressure, hence sound. A controller typically controls the motion responsive to an input signal representing a desired sound. The controller, which is typically off-chip, is not shown. It is appreciated that the controller typically comprises more than one control unit, each controlling one or more actuator modules of the type shown and illustrated in FIG. 1A, e.g. as described in detail below with reference to FIG. 4. The controller typically controls the relative motion of "its" actuator module or modules, directly. Alternatively, indirect control may be provided, e.g. via a latch or other intermediary mechanism.

Figure 3A:
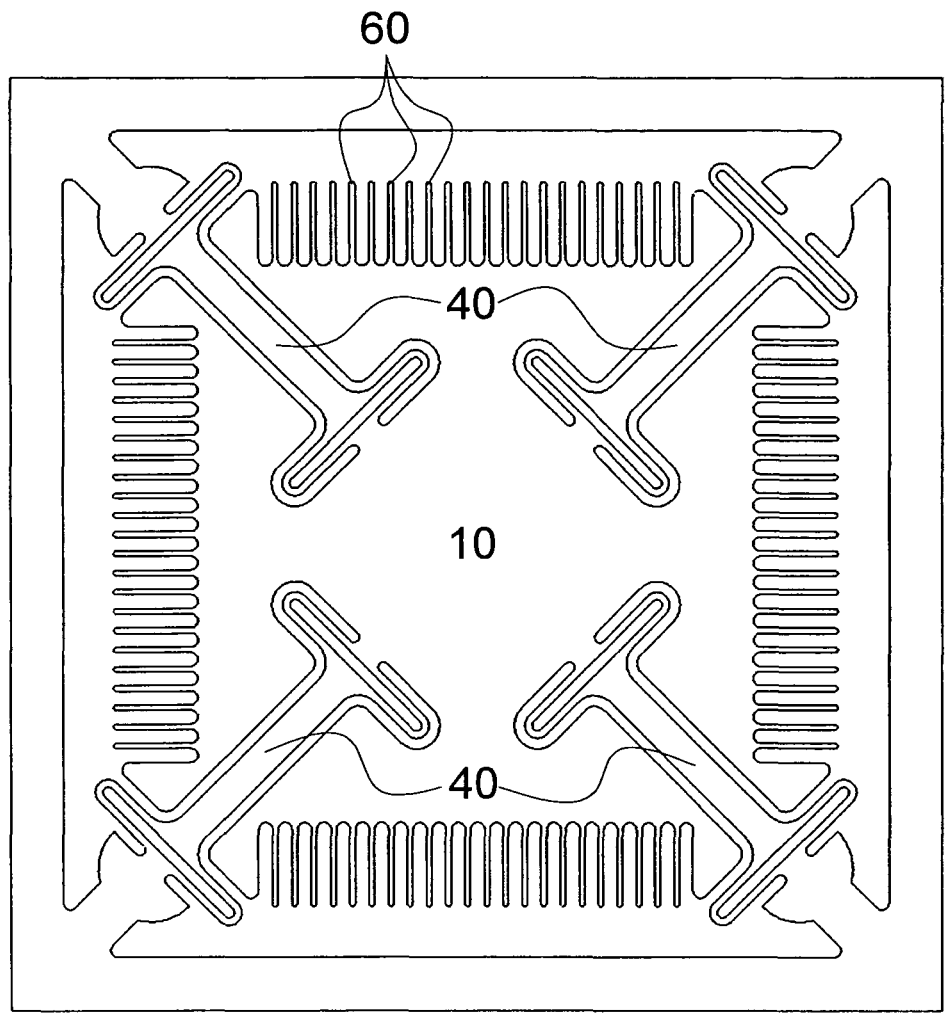
FIG. 3A is a top-view illustration of the module of FIGS. 1A-1B.

FIG. 3A is a top-view illustration of the system of FIGS. 1A-1B.

Figure 3B:
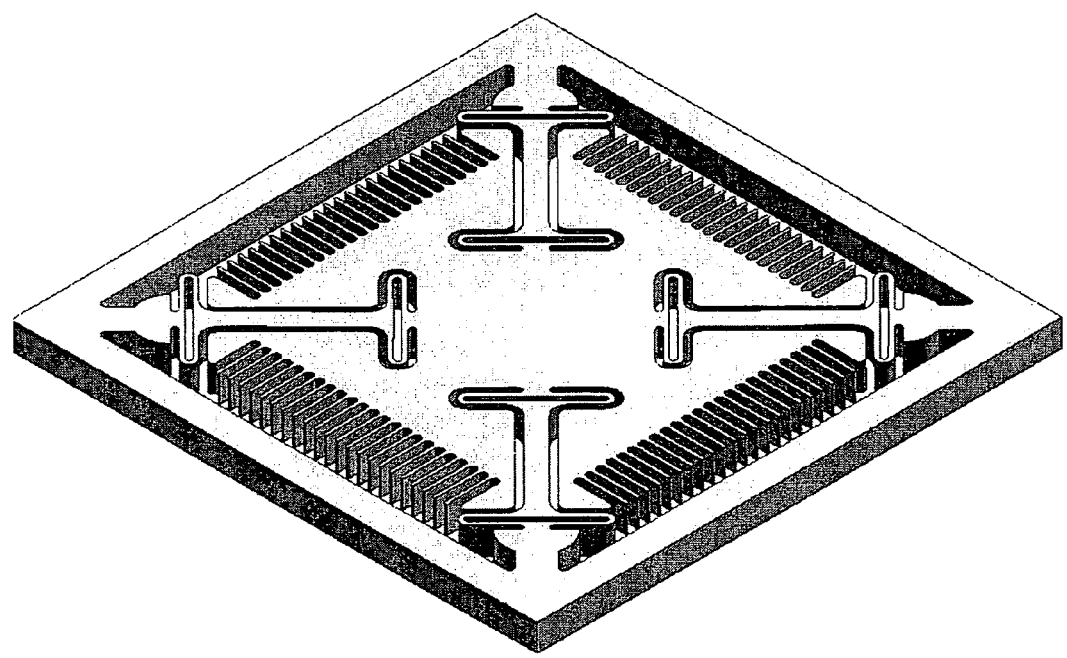
FIG. 3B is an isometric view of the rotor layer of the module of FIG. 3A when the rotor is disposed in a first extreme position in which the vibrating comb element assumes a minimally extended position.

FIG. 3B is an isometric view of the rotor layer of the module of FIG. 3A when the rotor is disposed in a first extreme position in which the vibrating comb element assumes a minimally extended position.

Figure 3C:
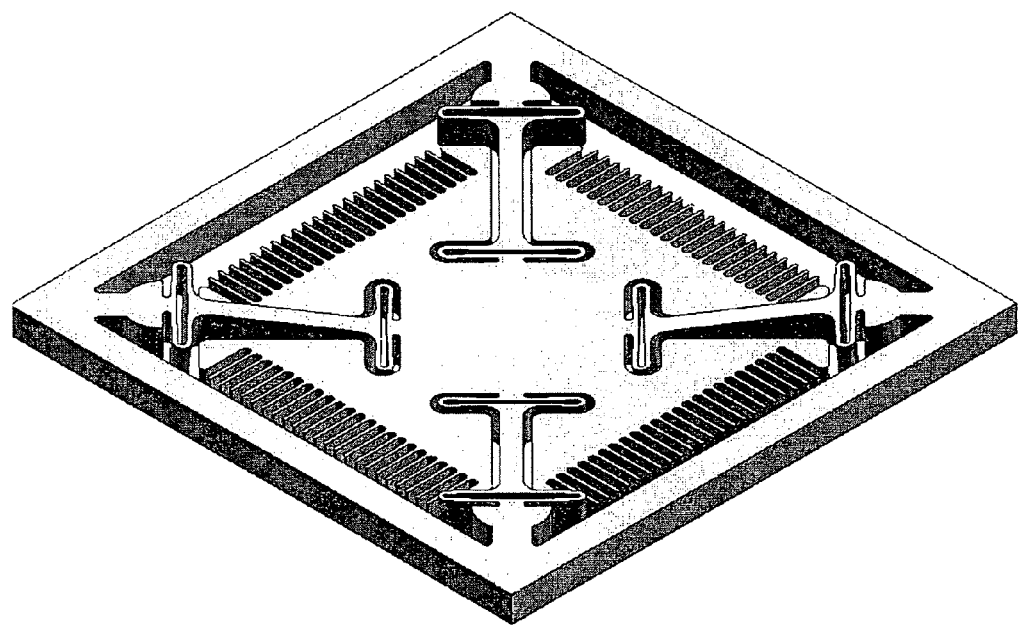
FIG. 3C is an isometric view of the rotor layer of the module of FIG. 3A when the rotor is disposed in a second extreme position in which the vibrating comb element assumes a maximally extended position.

FIG. 3C is an isometric view of the rotor layer of the module of FIG. 3A when the rotor is disposed in a second extreme position in which the vibrating comb element assumes a maximally extended position.

Figure 3D:
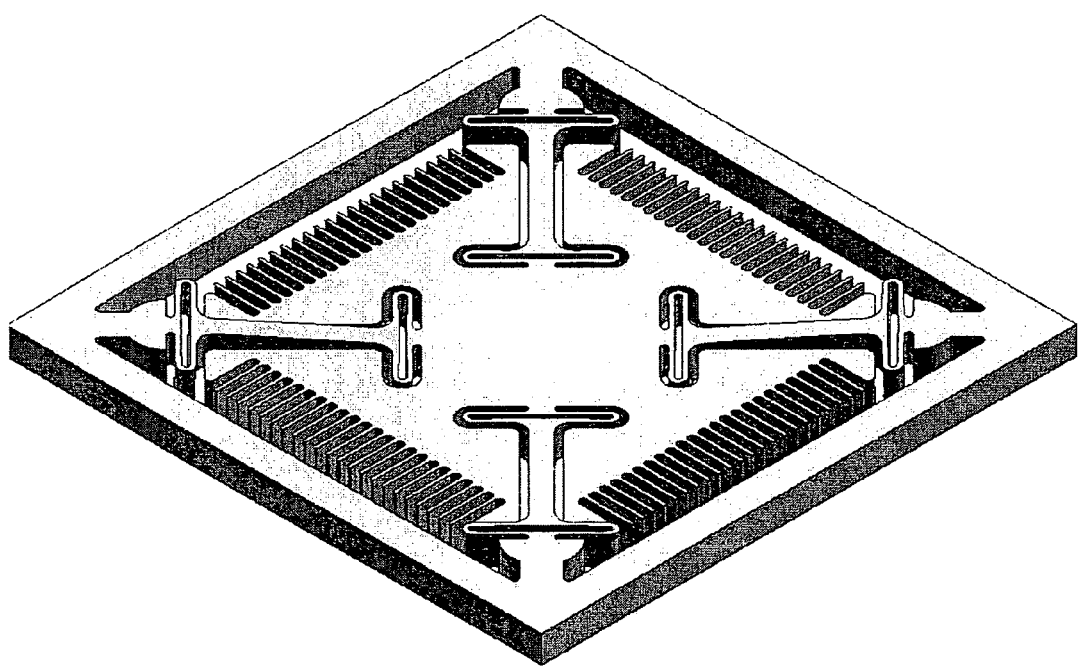
FIG. 3D is an isometric view of the rotor layer of the module of FIG. 3A when the rotor is disposed in a third intermediate position in which the vibrating comb element is in an intermediate position between its minimally extended and maximally extended extreme positions.

FIG. 3D is an isometric view of the rotor layer of the module of FIG. 3A when the rotor is disposed in a third intermediate position in which the vibrating comb element is in an intermediate position between its minimally extended and maximally extended extreme positions.

It is appreciated that another position, other than the maximally and minimally extended positions, that a vibrating comb element may assume, is its equilibrium position defined as the position the vibrating comb element 10 assumes once its movement has decayed and its velocity has reached zero, when no electro-static force is applied thereto.

Figure 4:
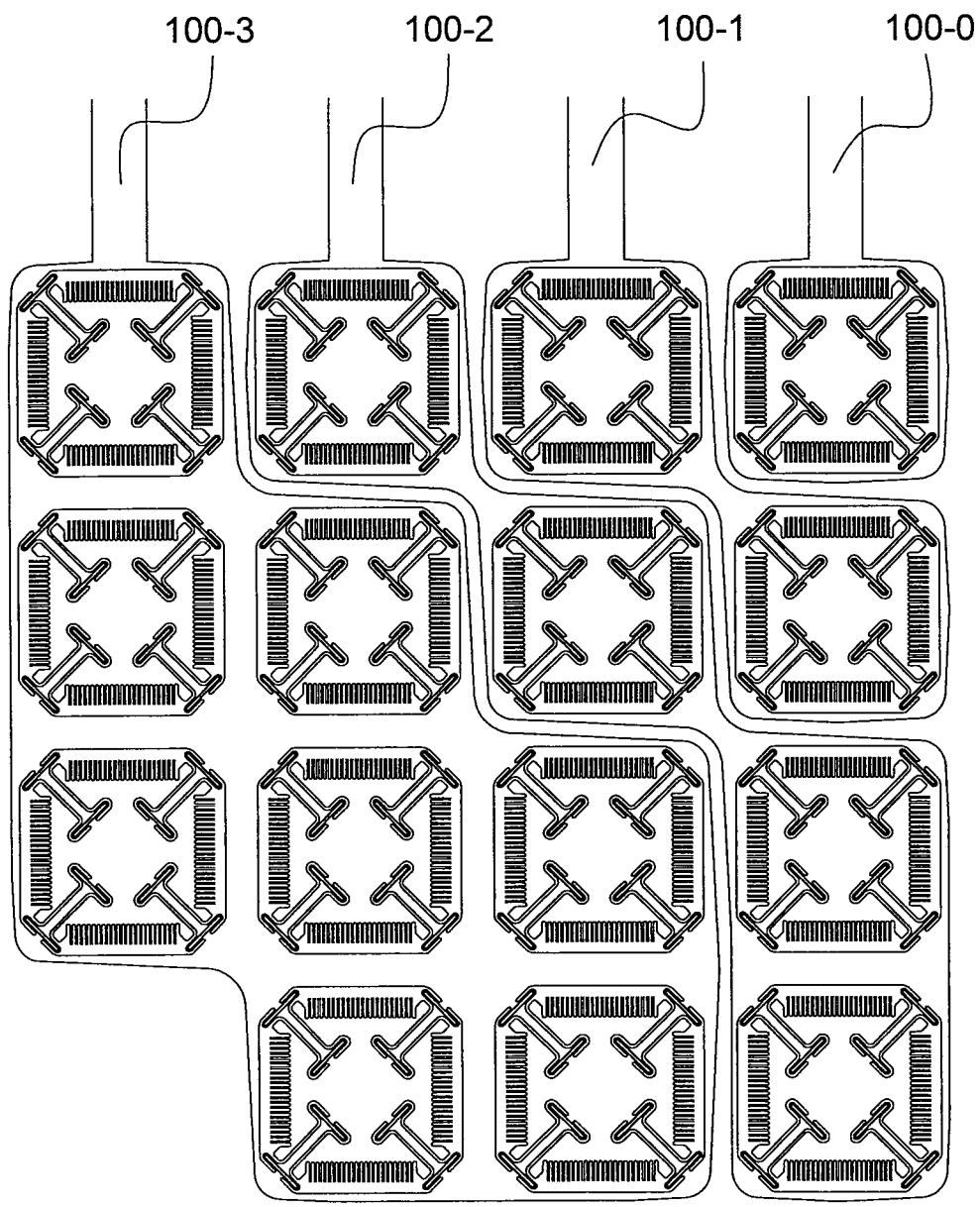
FIG. 4 is a top view illustration of an array of actuator modules, constructed and operative in accordance with certain embodiments of the present invention, each of which may be similar to the actuator module of FIGS. 1A-1B.

FIG. 4 is a top view illustration of an array of actuator modules, each of which may be similar to the actuator module of FIGS. 1A-1B. Typically, the actuator modules in the array are partitioned into sets each including a number of actuator modules which have a common control mechanism such that all actuator modules in each set move together, in unison. The number of actuator modules in each set is typically selected such that, for any desired number of actuator modules which it is desired to activate, it is possible to assemble one or several of the sets and obtain that desired number of actuator modules. For example, the actuator modules may be partitioned into sets of 1, 2, 4, 8, 16, ... actuator modules 100-0, 100-1, 100-2, 100-3, ... as illustrated in FIG. 4. If it is desired to activate 30 actuator modules, the sets of 16, 4 and 2 modules are activated. If it is desired to activate 20 actuator modules, the sets of 16 and 4 modules are activated, and so forth.

Figure 5A:
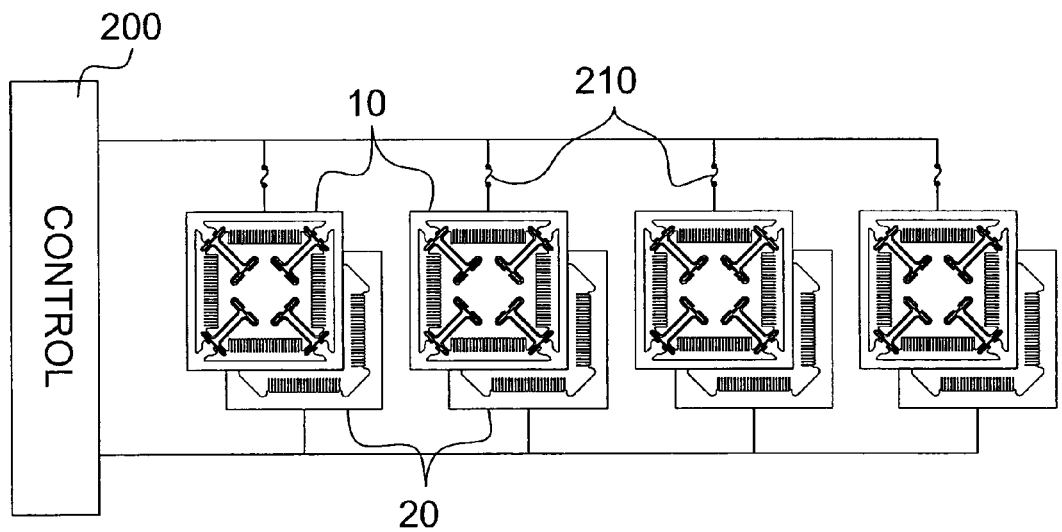
FIG. 5A is a schematic illustration of one of the sets of actuator modules shown in FIG. 4.

FIG. 5A is a schematic illustration of one of the sets of FIG. 4. As shown, all of the modules are connected typically in parallel to a single control unit 200. Optionally, the rotor 10 of each module is connected to the control unit 200 via its own fuse 210 such that, if one module is shorted e.g. due to undesirable motion of its teeth or because a foreign conductive object becomes trapped between its teeth, then the resulting high current burns out the fuse 210 and disconnects that module, and only that module, from the control unit 200, thus ensuring that only limited damage results from each short circuit. The stators of all of the modules are typically electrically interconnected. It is appreciated that in certain embodiments it may be desirable to interconnect the rotors of all the modules and dispose the fuses 210 between each of the stators and the control unit 200.

The sets of actuator modules may be arranged within the array of FIG. 4 in any suitable configuration. For example, if the actuator modules in each set are interconnected electrically in parallel to a single control unit, it may be desirable for each set to comprise a linear array of actuator modules or other adjacent arrangement of actuator modules.

It is appreciated that the sampling rate of the apparatus need not be equivalent to the sampling rate of the input signal. The sampling rate of the apparatus $f_s$ is pre-defined by the system designer and unless the sampling rate of the digital audio signal happens to be the same, the input signal is typically re-sampled using a re-sampling module that may or may not be part of the control unit 200.

Generally, the control unit 200 receives an input sound to be reproduced from a signal source (not shown) which may for example comprise a microphone, MP3, CD or any other suitable signal source. It is appreciated that the controller module can optionally condition the input signal, by performing conventional sound conditioning operations such as but not limited to impedance matching, amplifying or changing volume, equalizing, and adding sound effects. The output of the controller 200 is an alternating current corresponding to the conditioned input signal which serves as the control signal for the apparatus shown and described herein.

Figure 5B:
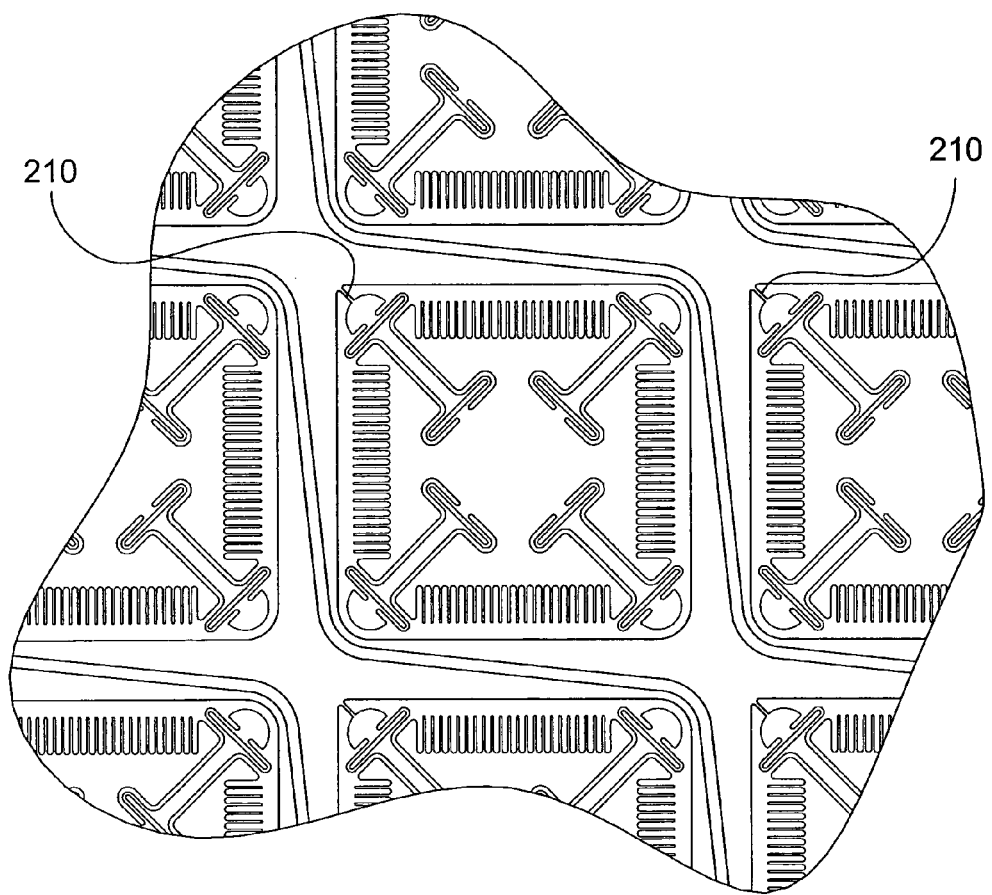
FIG. 5B is a schematic illustration of an embodiment of the module of FIG. 5A showing one possible implementation of the fuses thereof, constructed and operative in accordance with certain embodiments of the present invention.

FIG. 5B is a schematic illustration of an embodiment of the apparatus of FIG. 5A showing one possible implementation of the fuses 210.

Figure 6:
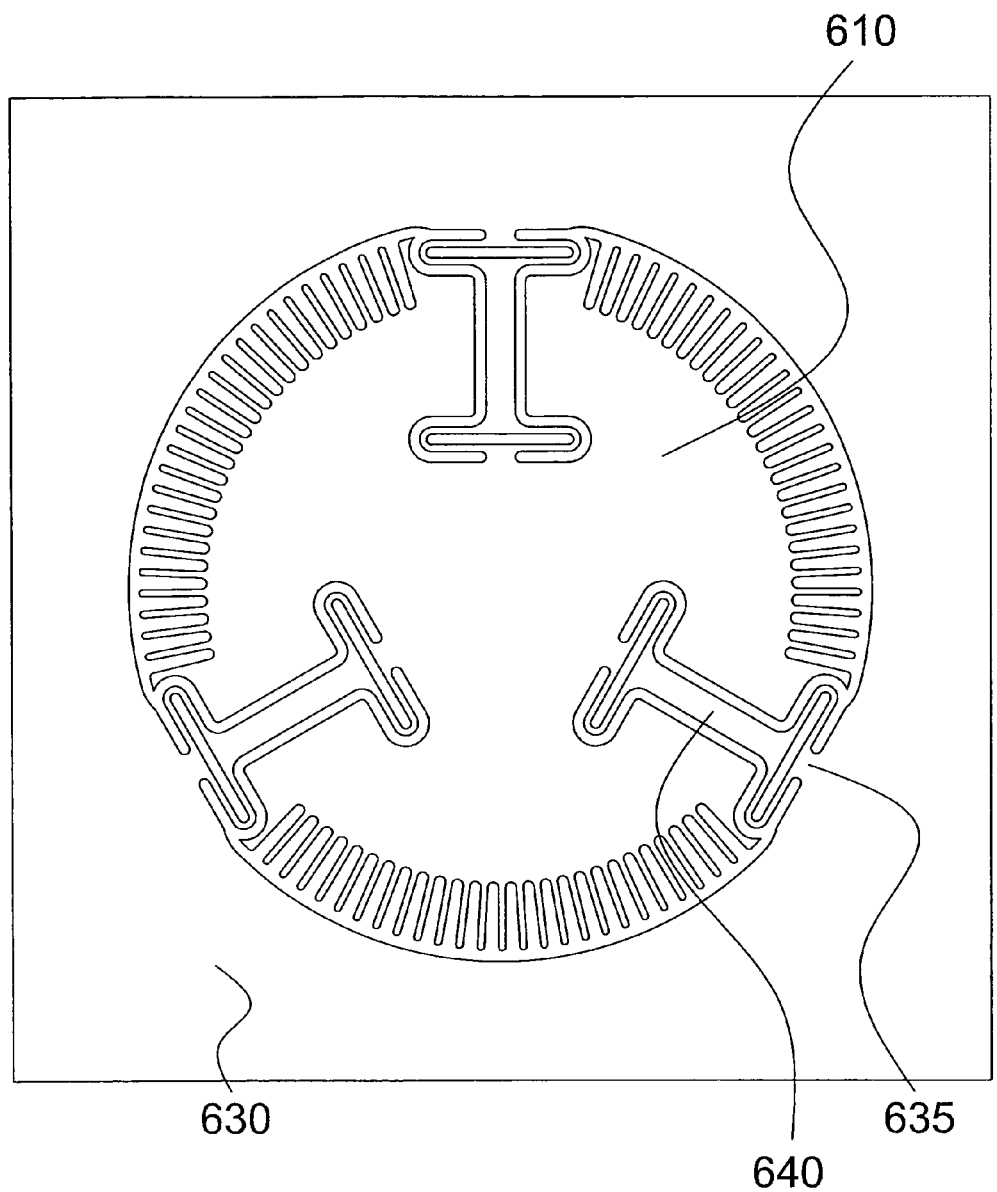
FIG. 6 is a variation, constructed and operative in accordance with certain embodiments of the present invention, on the modules of FIGS. 1A-1B in which the moving comb and perhaps even the frame, each have a circular configuration.

FIG. 6 is a variation on the modules of FIGS. 1A-1B in which the moving comb and perhaps even the frame, each have a circular configuration. In particular, the moving comb element 610 describes a first circle and the frame 630 describes a second circle concentric to and larger than the first circle although alternatively the frame 630 may have any other configuration which anchors the bases 635 of the flexures 640. It is appreciated that any other configuration, other than the square configuration shown in FIG. 1A and the circular configuration shown in FIG. 6, may also be used.

Also, it is appreciated that any suitable number of, and distribution of, flexures may be employed. In FIG. 1A, four flexures are employed which are located at the vertices of the square defined by the comb drive although this need not be the case. In FIG. 6, 3 flexures are employed which are evenly distributed along the circular perimeter of the comb drive. However alternatively, other numbers of flexures may be employed and distributed, not necessarily symmetrically or evenly, as suitable for the application.

Figure 7A:
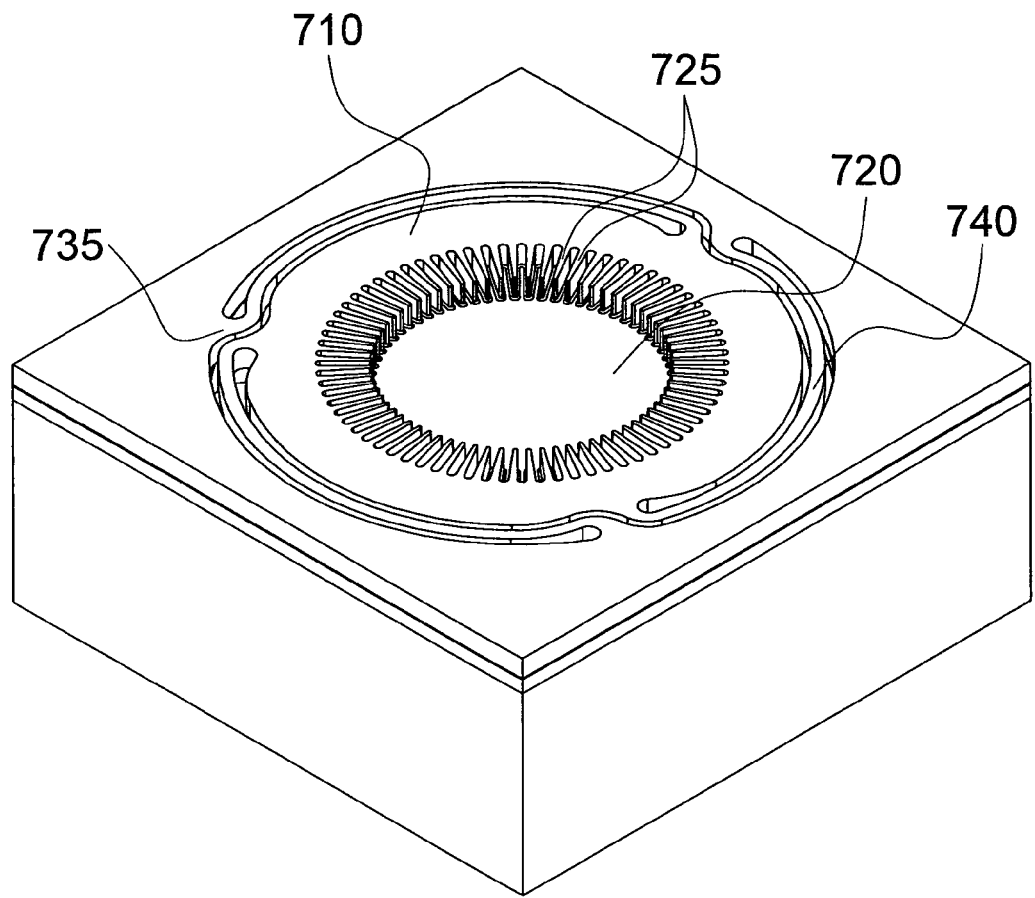
FIG. 7A is a variation, constructed and operative in accordance with certain embodiments of the present invention, on the module of FIG. 6 in which the moving comb element is peripheral or external to the stationary comb element, whereas in FIGS. 1A-6, the stationary comb element is peripheral or external to the moving comb element.

FIG. 7A is a variation on the apparatus of FIG. 6 in which the moving comb element is peripheral or external to the stationary comb element, whereas in FIGS. 1 and 6, the stationary comb element 720 is peripheral or external to the moving comb element. The flexures 740 in FIG. 7A may be of the bending beam type. The central, stationary comb element is maintained stationary by a suitable structure 750 (FIG. 9) e.g. one or more structural arms 760.

Figure 7B:
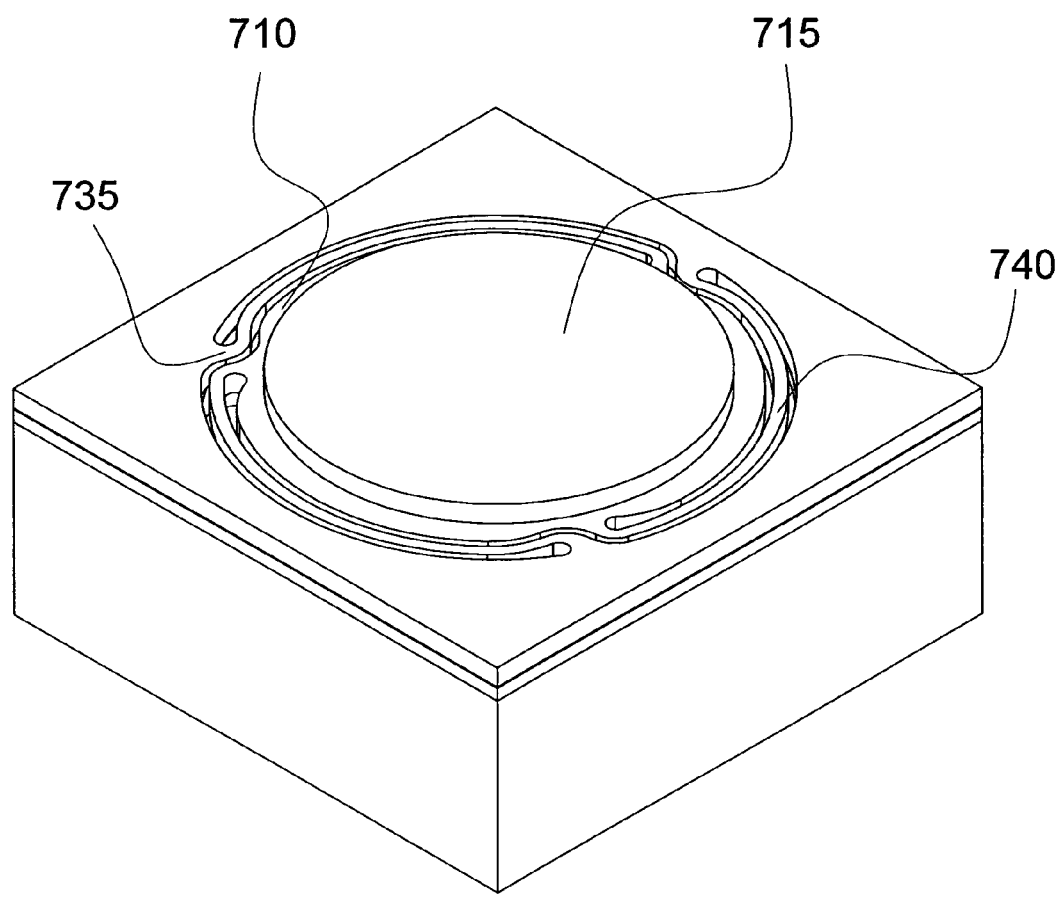
FIG. 7B is an isometric illustration of a module similar to the module of FIG. 7A except that a structural disc is bonded to the vibrating comb element such that at least most of the teeth of the vibrating comb element are covered.

FIG. 7B is an isometric illustration of apparatus similar to the apparatus of FIG. 7A except that a structural disc 715 which may be formed of any suitable rigid material such as silicon, is bonded to the vibrating comb element 710 such that most or preferably all of the teeth 725 of the vibrating comb element 710 are covered.

It is appreciated that another position, other than the maximally and minimally extended positions, that a vibrating comb element may assume, is its "equilibrium position", defined as the position the vibrating comb element 10 assumes once its movement has decayed and its velocity has reached zero, when no electro-static force is applied thereto.

Figure 8A:
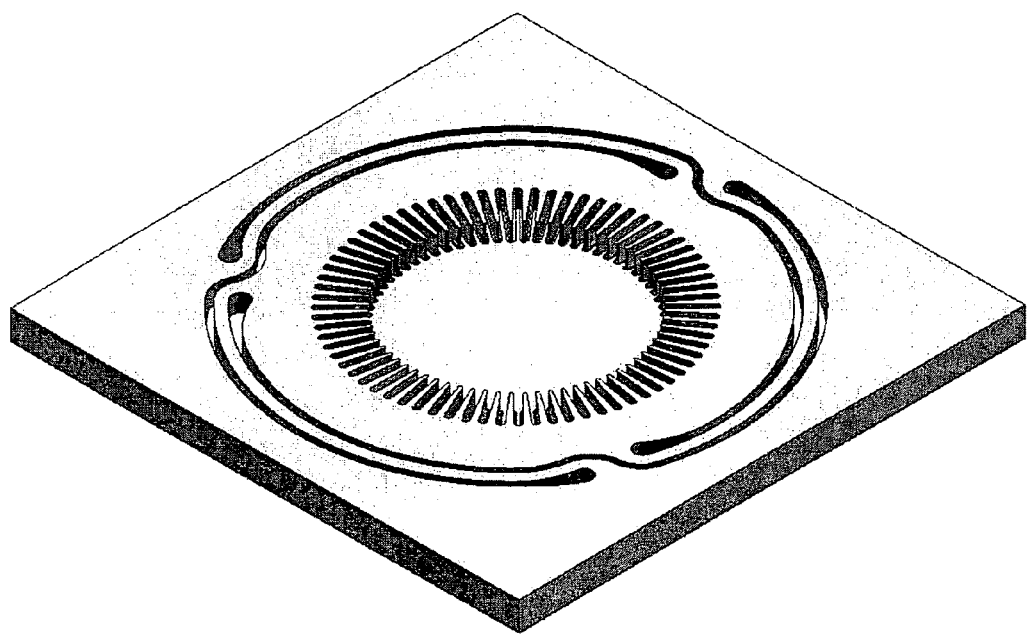
FIGS. 8A-8C are isometric illustrations of the top layer of the module of FIG. 7A, in which the comb drive apparatus is disposed respectively in a first extreme position in which the vibrating comb element assumes a minimally extended position, in a second extreme position in which the vibrating comb element assumes a maximally extended position, and in an intermediate position.
Figure 8B:
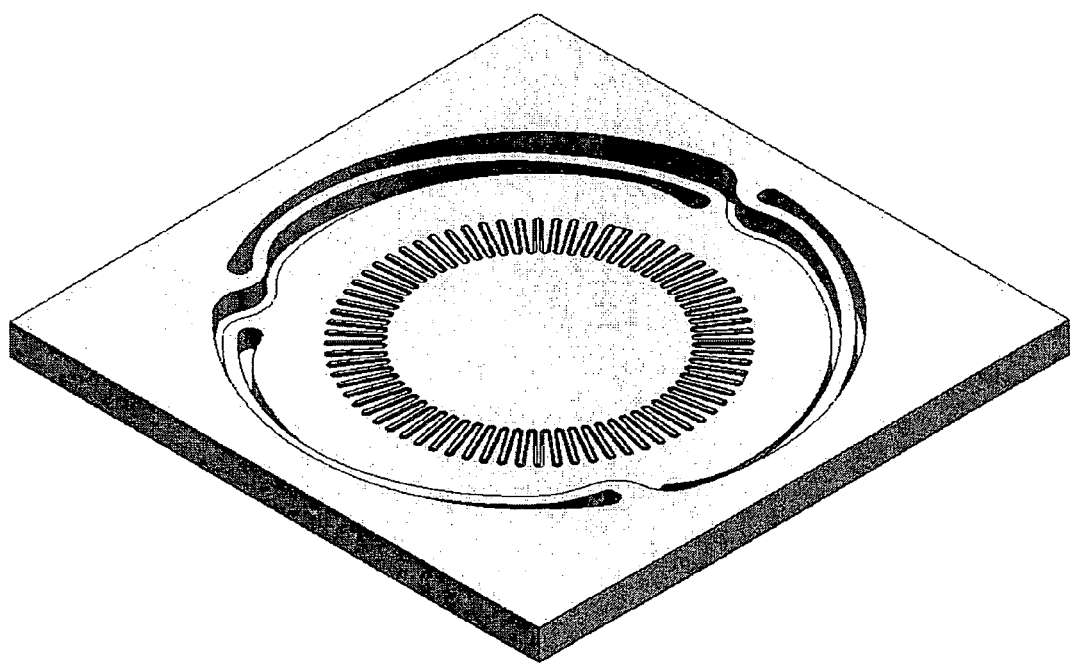
Figure 8C:
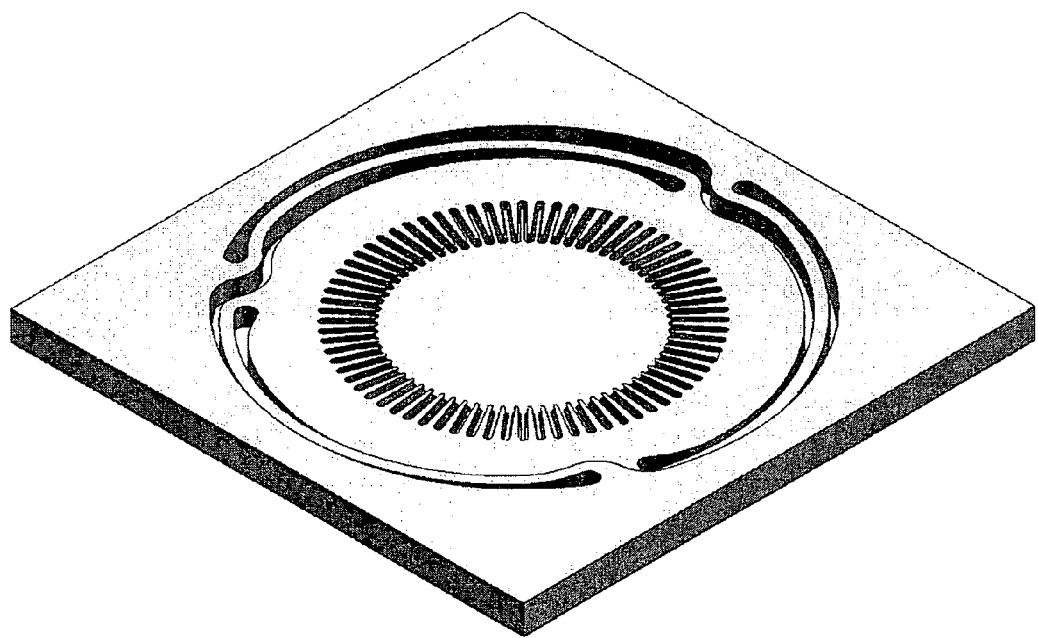

FIGS. 8A-8C are isometric views of the rotor layer of the module of FIG. 7. In FIG. 8A, the actuator module is illustrated in a first extreme position in which the rotor 710 assumes a minimally extended position. In FIG. 8B, the actuator module is illustrated in a second extreme position in which the rotor 710 assumes a maximally extended position. In FIG. 8C, the actuator module is illustrated in an intermediate position in which the rotor 710 assumes an intermediate position between the minimally extended and maximally extended positions shown in FIGS. 8A and 8B respectively.

Figure 9:
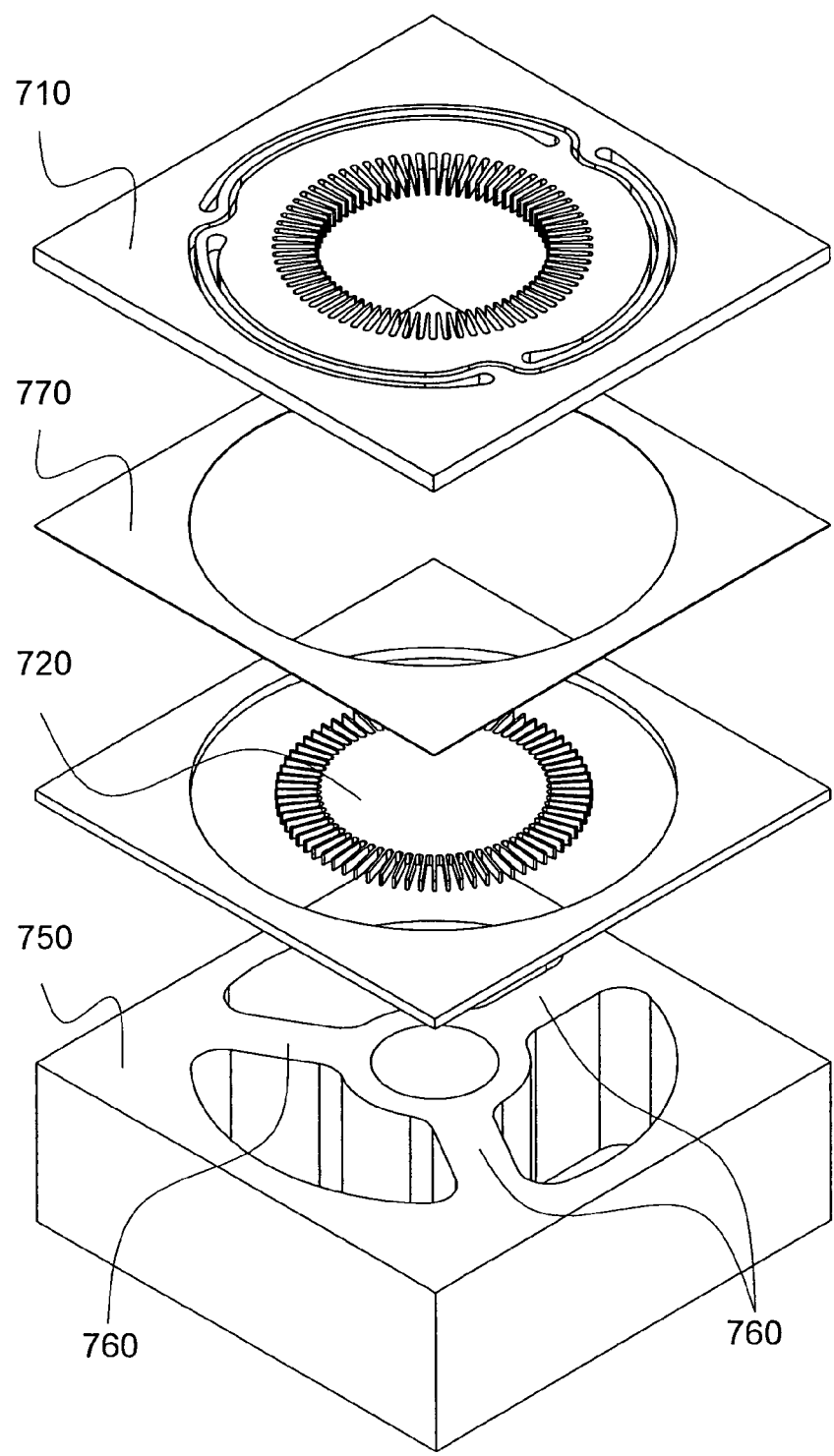
FIG. 9 is an exploded view of the module of FIG. 7A.

FIG. 9 is an exploded view of the apparatus of FIGS. 7A-7B. As shown, the central, stationary comb element 720 is maintained stationary by a suitable structure 750 e.g. one or more structural arms 760. It is appreciated that the number of and position of structural arms may be independent of the number of and position of the flexures and the fact that 3 of each are illustrated herein is merely by way of example.

A particular feature of certain embodiments of the present invention is that the controller 200 is only capable of controlling the electrostatic force attracting the stationary and moving comb elements to each another and there is no direct application of an opposite, repelling force. According to certain embodiments of the present invention, the force pulling the stationary and moving comb elements apart is the force applied by the spring or flexures. This force is not directly controlled by the controller 200 and rather depends on the displacement. In contrast, in the apparatus described in co-pending PCT application No. PCT/IL2007/000622, it is possible to create either of two oppositely directed controllable forces. Therefore, while it is possible to provide the same pattern of movement as that described in co-pending PCT application No. PCT/IL2007/0006, a different control method, e.g. as described herein, is typically employed to do so.

Typically, the controller 200 is operative to ensure the following:

(a) that when a vibrating comb element 10 moves in one direction e.g. up, it generates a positive pressure pulse. When it moves in the other direction e.g. down, it generates a negative pressure pulse. All other things being equal, it is believed to be advisable for the positive and negative pressure pulses to be substantially congruent, or equal in shape and magnitude. Alternatively, a different relation between the positive and negative pressure pulses may be employed e.g. if it is desired to generate net air velocity in one direction or another. For example, pump functionality may be desirable e.g. for cooling purposes, in certain applications.

(b) that the vibrating comb element 10 should move only when it is desired to produce a sound therefrom, and should be stationary when it is not desired to produce a sound therefrom.

The apparatus of the present invention is intended to generate sound in accordance with an audio signal. In certain embodiments of the present invention, the audio signal comprises a stream of digital samples of a desired audio signal. It is appreciated that in certain embodiments of the current invention, the apparatus of the present invention is operative to generate sound (which may be sonic, ultrasonic or subsonic) as a response to an analog signal, e.g. a signal representing the pressure vs. time of the desired audio. If such is the case, the system designer may provide a suitable analog to digital converter to convert the audio signal into a stream of digital samples of the desired audio signal.

Alternatively, the apparatus may generate sound directly from an analog audio signal. This may be accomplished by connecting all of the actuator modules in the array, e.g. in parallel, to the controller 200 and applying voltage, between the vibrating and stationary comb elements of all of the actuator modules in the array, whose magnitude is proportional to the analog audio input signal. The controller 200, in such embodiments, performs one or more of the following tasks, prior to feeding the signal to the array of actuator modules:

a. matches the impedances between some or all of the following components: the actuator apparatus, the signal source, the cable connecting therebetween, the array of actuator modules.

b. adds bias to the input signal. It is appreciated that while the input signal may be signed i.e. the polarity of the signal may be positive or negative, the voltage applied between the vibrating and stationary comb elements creates an attracting force, regardless of the polarity of the voltage. To overcome this, a bias is added to the input signal to ensure it never becomes negative. The value of the bias is typically equal to or greater than the maximal expected negative value of the input signal;

c. amplifies the signal and/or allows the volume thereof to be modified;

d. adds sound effects;

e. processes the input signal so as to improve or otherwise alter its properties, e.g. change its dynamic range, filter it, equalize it, add echo and reverb etc.

The actuator devices shown and described herein are typically operative to generate a sound whose intensity corresponds to intensity values coded into an input digital signal. Any suitable coding protocol may be employed to generate the input digital signal such as but not limited to PCM or PWM (SACD) protocols. Alternatively or in addition the device may support compressed digital protocols such as ADPCM, MP3, WMA, AAC, or AC3 in which case a decoder typically converts the compressed signal into an uncompressed form such as PCM. It is appreciated that the sampling rate of the digital audio signal may be different from the sampling rate of the apparatus of the present invention. If such is the case, a sampling rate converter may be provided, either separately or as part of the controller 200, converting the sampling rate of the digital audio signal to that of the apparatus.

A method by which controller 200, associated with a certain set of actuator modules which may comprise, for example, 1 or 2 or 4 or, generally, $2^n$ actuator modules currently disposed in their maximally extended positions as shown in FIGS. 3C and 8B, causes each actuator module in its set to retain its maximally extended position, is now described. A method by which controller 200, associated with a certain set of actuator modules which may comprise, for example, 1 or 2 or 4 or, generally, $2^n$ actuator modules currently disposed in their maximally extended positions as shown in FIGS. 3C and 8B, causes each actuator module in its set to move to their respective minimally extended positions is also described. A method by which controller 200, associated with a certain set of actuator modules which may comprise, for example, 1 or 2 or 4 or, generally, $2^n$ actuator modules currently disposed in their minimally extended positions as shown in FIGS. 3B and 8A, causes each actuator module in its set to retain its minimally extended position, is also now described. A method by which controller 200, associated with a certain set of actuator modules which may comprise, for example, 1 or 2 or 4 or, generally, $2^n$ actuator modules currently disposed in their minimally extended positions as shown in FIGS. 3B and 8A, causes each actuator module in its set to move to their respective maximally extended positions is also now described.

Figure 10:
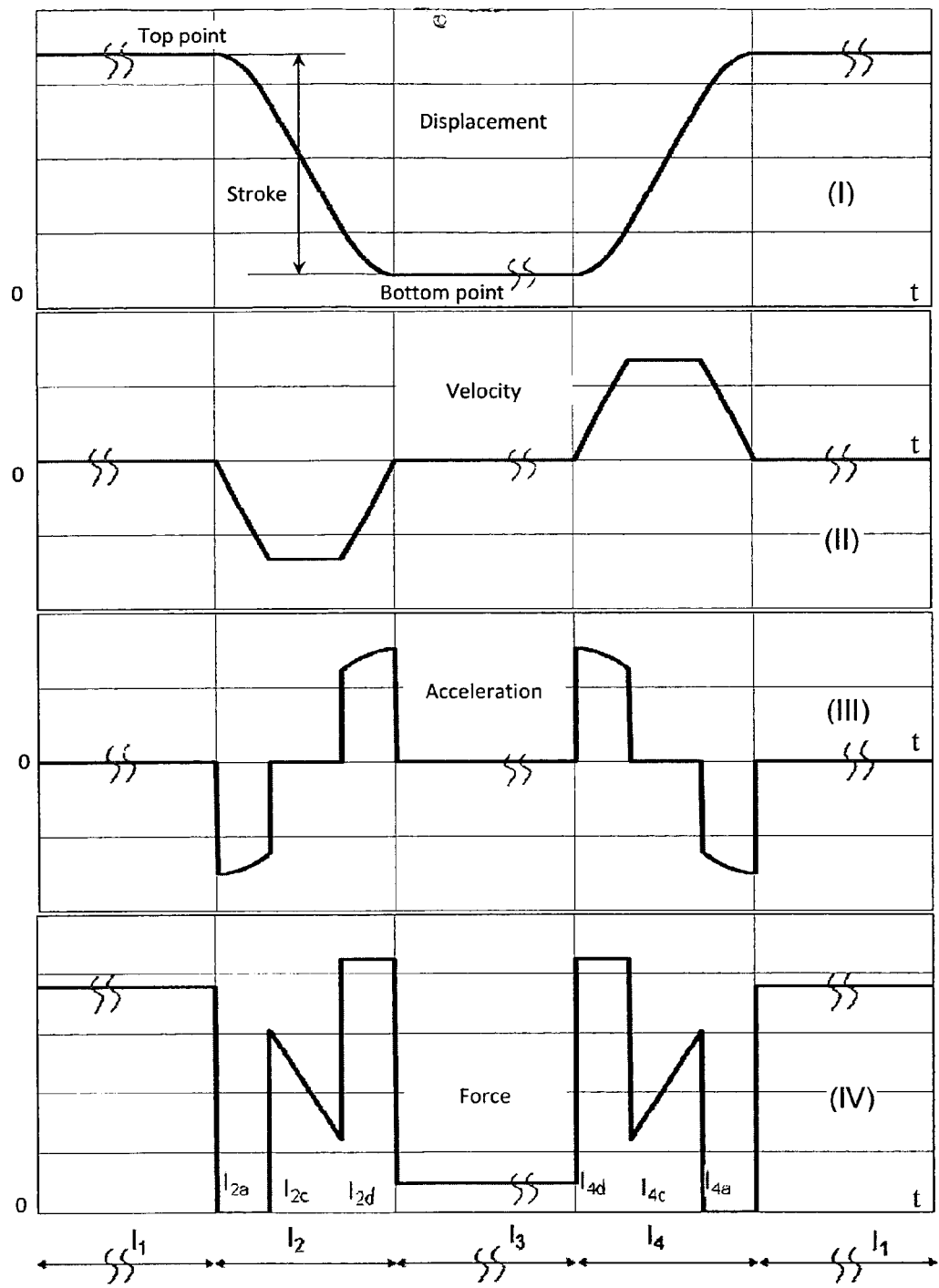
FIG. 10 includes a force vs. time graph (IV) which, if used for programming the controller of FIG. 5A to provide an attracting electrostatic force between the moving and stationary comb elements, results in the moving comb element having acceleration, velocity and displacement patterns in accordance with graphs III, II and I respectively.

FIG. 10 includes a force vs. time graph (IV) which, if used for programming the controller of FIG. 5A to provide an attracting electrostatic force between the moving and stationary comb elements, results in the moving comb element having acceleration, velocity and displacement patterns in accordance with graphs III, II and I respectively. In certain embodiments of the current invention, the at least one actuator element includes a plurality of actuator elements. These may be divided into subsets, each of which comprises one or more actuator elements that are connected together to one of the outputs of the controller of FIG. 5A.

Without loss of generality, all of the four control methods described above are illustrated in FIG. 10 which includes a moving comb displacement vs. time graph (I) showing the displacement of an actuator module which typically follows the pattern shown, namely: a time interval I1, which is c1 clocks in length (c1=0, 1, . . . ) in which the actuator module is retained in its maximally extended position, followed by a 1 clock long time interval I2, in which the actuator module moves from its maximally extended position to its minimally extended position, followed by a time interval of time I3, which is c3 clocks in length (c3=0, 1, . . . ) in which the actuator module is retained in its minimally extended position, followed by a 1 clock long time interval I4, in which the actuator module moves from its minimally extended position back to its maximally extended position. The displacement vs. time graph can be achieved, for each set of actuator modules, by programming the controller 200 to provide electrostatic force in accordance with the force-time graph (IV). In the present specification, I2 and I4 are termed "motion intervals" and I1 and I3 are termed "stationary intervals".

FIG. 10 also includes a graph of the velocity (curve II—also termed herein a "velocity pattern") and acceleration (curve III—also termed herein an "acceleration pattern" and typically including periods of acceleration and periods of deceleration) of each of the actuator modules which results from application of electrostatic force in accordance with the force-time graph (IV). A particular feature of certain embodiments of the present invention is that the actuator module reaches its extreme positions (i.e. its maximally extended position and its minimally extended position) with a velocity of zero and hence, without transit oscillation as it assumes these extreme positions. The velocity graph during time intervals I2 and I4 typically includes an initial acceleration sub-interval, a congruent final deceleration sub-interval, and an optional constant velocity sub-interval between the two. Within time interval I2, these sub-intervals are denoted herein I2$a$, I2$c$ and I2$d$ respectively. Within time interval I4, these sub-intervals are denoted herein I4$a$, I4$c$ and I4$d$ respectively. α is used as a parameter of the control pattern of FIG. 10 indicating the proportion of each time interval T (where T=2× clock) which is devoted to acceleration. It is appreciated that an equal proportion of each time interval T is devoted to deceleration.

The electrostatic force applied during the initial acceleration sub-interval of each time interval I2 is typically zero such that all acceleration is being provided by the spring. Similarly, the electrostatic force applied during the final, deceleration sub-interval of each time interval I4 is typically zero such that all deceleration is being provided by the spring.

In time interval I1, a high-magnitude typically constant electro-static force is applied to retain the actuator modules in the set being controlled, in their maximally extended positions. As time interval I1 terminates, the spring is released, bringing the electro-static force immediately down to zero. The next time interval, I2, begins as described above, with a zero-force sub-interval I2$a$ which terminates when the actuator module has achieved a pre-determined desirable velocity which is then maintained, for a sub-interval I2$c$ whose duration is zero or longer, by providing an electrostatic force which is at each point in time, equal to and opposite in direction to, the spring force. During sub-interval I2$a$, the velocity is typically sinusoidal, the parameters being determined by the spring.

Subsequently, in sub-interval I2$d$, is typically constant and perhaps even higher than in time interval I1, in order to provide deceleration which is symmetric or congruent to the acceleration which occurred in sub-interval I2$a$. In time interval I3, similarly to time interval I1, the electro-static force is constant, however its magnitude is less, even zero, reflecting the fact that the opposing spring force operating when the actuator module is in its minimally extended position is less than when the actuator module is in its maximally extended position. In fact, the opposing spring force operating when the actuator module is in its minimally extended position may even be zero. In time interval I3 as in time interval I1, the magnitude of the electro-static force equals the magnitude of the spring force. The electrostatic force operating during sub-interval I4$a$ is typically the same as that operating during sub-interval I2$d$ as described above. The electrostatic force operating during sub-interval I4$d$ is typically zero, as in sub-interval I2$a$ as described above. During sub-interval I4$c$, whose duration is zero or longer, a pre-determined desirable velocity is then maintained, by providing an electrostatic force which is at each point in time, equal to and opposite in direction to, the spring force.

It is appreciated that in certain embodiments of the present invention, the positive pressure pulse produced by the movement of the vibrating element as it translates from its first extreme position to its second extreme position may differ, in shape as well as in sign, from the negative pressure pulse produced by the vibrating element as it translates from its second extreme position to its first extreme position, even if the velocity vs. time patterns of both movements are substantially equal.

If such is the case, or if the application mandates that the positive and negative pressure pulses be different, it is possible to change the pressure patterns by changing the translation velocity in one direction relative to the translation velocity in the other direction. Changing the translation velocity may be achieved using one or more of the following methods inter alia:

a. Changing the force vs. time pattern in sub-intervals I2$a$, I2$c$ and I2$d$ compared to the force vs. time pattern in sub-intervals I4$a$, I4$c$ and I4$d$, such that the displacement of the vibrating element in interval I2 remains the same as the displacement of the vibrating element in interval I4, e.g. by increasing the acceleration and deceleration rates while respectively shortening the acceleration and deceleration durations.

b. Changing the duration of interval I2 compared to the duration of interval I4 such that the sum of the two intervals remains the same, e.g. by setting I2$_{new}$=I2$_{old}$+t and I4$_{new}$=I4$_{old}$−t c. Changing the geometry of one or more of the components of the actuator. The pressure patterns produced by the vibrating element may be simulated using appropriate tools e.g. CFD (Computerized Fluid Dynamics) software.

FIG. 11 is a table showing example acceleration functions for each of the time intervals and sub-intervals in the graphs of FIG. 10.

FIG. 12 is a table showing example velocity functions for each of the time intervals and sub-intervals in the graphs of FIG. 10.

FIG. 13 is a table showing example displacement functions for each of the time intervals and sub-intervals in the graphs of FIG. 10.

FIG. 14A is a table showing example electrostatic force functions for each of the time intervals and sub-intervals in the graphs of FIG. 10.

FIG. 14B is a table showing example voltage functions for each of the time intervals and sub-intervals in the graphs of FIG. 10.

FIGS. 15A-15B, taken together, form a table explaining the notation used in FIGS. 11-14B.

It is appreciated that in practice, the electrostatic force-time graph of FIG. 10 (graph IV), hence also graphs (I)-(III) are typically smoother than that illustrated; the graph (IV) and hence graphs (I)-(III), are, for simplicity, ideal or theoretical graphs. In practice, of course, the electrostatic force-time graph is finalized, by a conventional adjustment and optimization process, e.g. using conventional performance-checking experiments conducted on real structures.

The resonance frequency of the moving vibrating comb element 10 may be determined as follows:

a. Select a sampling rate (clock frequency) for the actuator as is known in the art, e.g. as described in PCT/IL2007/000622, published as WO/2007/135680 and entitled "Apparatus and methods for generating pressure waves". The sampling rate is typically ultrasonic and may for example be twice the highest frequency the actuator is designed to produce.

b. The following formula allows a suitable natural resonance frequency value to be determined as a function of desired sampling rate as selected in (a), maximal voltage being employed, preload value and desired amplitude:

A suitable natural resonance frequency value is determined as a function of desired sampling rate as selected in (a), maximal voltage being employed, preload value and desired amplitude. Typically, the natural frequency value is determined by design and the vibrating element and desired sampling rate are selected as in (a). The following formula is useful in selecting a suitable movement parameter α in accordance with this embodiment of the present invention:

$$2\cos(2\pi\alpha\beta) - \pi\beta(1-4\alpha)\sin(2\pi\alpha\beta) \geq 1$$

c. Use mechanical FEA (Finite Element Analysis) software to model and simulate resonance of the structure.

d. Adjust the parameters of the model to match the natural resonance frequency yielded by the software, with the target resonance frequency determined in step (b). In general the mechanical resonance frequency depends on the mass of the vibrating element: the higher the mass the lower the resonance frequency and vice versa. The natural frequency also depends on the combined spring coefficient of all the flexures: the higher the coefficient, the higher the frequency. These monotonically increasing relationships may not be linear. The mass of the vibrating element may be varied as necessary by changing the size (e.g. thickness or length or width) of the element or by changing its density (e.g. selecting different material for parts or for the entire element). The combined spring coefficient of the flexures may be changed used by any suitable method known in the art, such as but not limited to one or more of the following:

1. Adding flexures increases the spring coefficient;
2. Lengthening the flexures decreases the spring coefficient;
3. Reducing the cross sectional area of the flexures decreases the spring coefficient; and/or
4. Selecting flexure material with a lower Young Modulus decreases the spring coefficient.

e. Using the adjusted parameters, build an actual device and test against simulation results.

f. If the simulated and measured results are different, adjust the mechanical FEA software parameters (e.g. the Young Modulus of the material used in the simulation) and repeat steps c-e.

Figure 16:
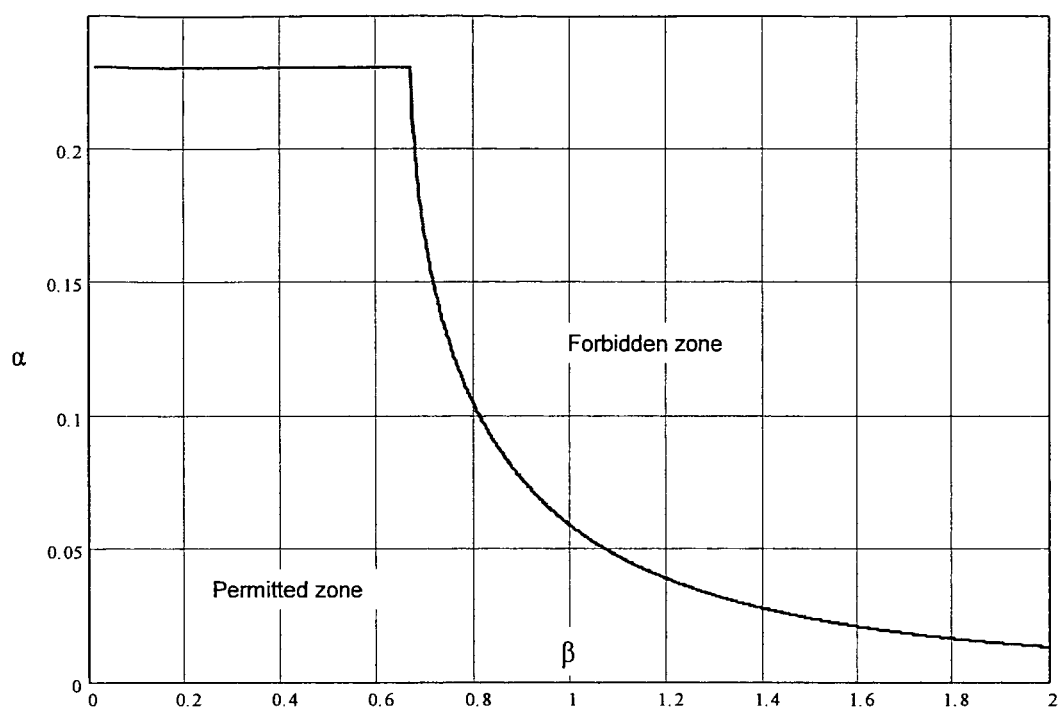
FIG. 16 is a graph showing permitted and forbidden values for design parameters $\alpha$ and $\beta$ according to certain embodiments of the present invention.

When building the apparatus of FIG. 1A, a parameter called β which is directly selectable during the design process is used herein to denote the ratio between the natural frequency of the vibrating comb element 10 and the sampling frequency. According to certain embodiments of the present invention, as shown in FIG. 16, selection of β limits the possible values for α; for example, if β<⅔ then α can be any value smaller than or equal to 0.25; however if β=0.8 then α must be less than or equal to 0.104 and if β=1.2 then α must be less than or equal to 0.039. Conversely, according to certain embodiments of the present invention, if α is selected first, β must be selected accordingly, as per the graph of FIG. 16. For example, if α=0.25 then β must be less than or equal to ⅔; if α=0.125 then β must be less than or equal to 0.753; and if α=0.03 then β must be less than or equal to 1.347. On the other hand, a particular stroke length is achieved by applying a suitable voltage between the stationary and moving electrodes to generate the expected electrostatic force. The voltage U to be applied to generate force $F_{est}$ may be:

$$F_{est} = 0.5 k_{border} \frac{\varepsilon_m \varepsilon_0 L}{\delta} U^2 \quad \text{(f2)}$$

where

L is the total active perimeter of interacting combs [meters];

δ is the air-gap between interacting combs relating to different electrodes [meters];

$k_{border}$ is a border (also known as a "fringe-effect" region) electric field factor (typically $k_{border}$=0.6 . . . 1)

$\varepsilon_m$ the relative permittivity of the medium in which the apparatus is disposed $\varepsilon_0$ the static permittivity of vacuum ~8.854×10⁻¹² [Farad/meter]

Using a normalized voltage approach:

$$\overline{U}(t) = \sqrt{F_{est}(t)} \quad \text{(f3)}$$

Since the electrostatic force, which reaches its minimal level at interval I3 can not be negative then:

$$2\cos(2\pi\alpha\beta) - \pi\beta(1-4\alpha)\sin(2\pi\alpha\beta) \geq 1.$$

which may restrict possible choices of parameters α and β. For example:

if α=0.25 then β is less than or equal to ⅔;
if α=0.125 then β is less than or equal to 0.753
if α=0.03 then β is less than or equal to 1.347
if β≤⅔ then α is less than or equal to 0.25
if β=0.8 then α is less than or equal to 0.104
if β=1.2 then α is less than or equal to 0.039

It is appreciated that, for simplicity, the values presented above are the result of theoretical hence approximate computations, not taking into account conventional parameters such as manufacturing tolerances. Also, a system designer may choose to use different parameters which offer less efficient but more reliable operation.

Figure 17A:
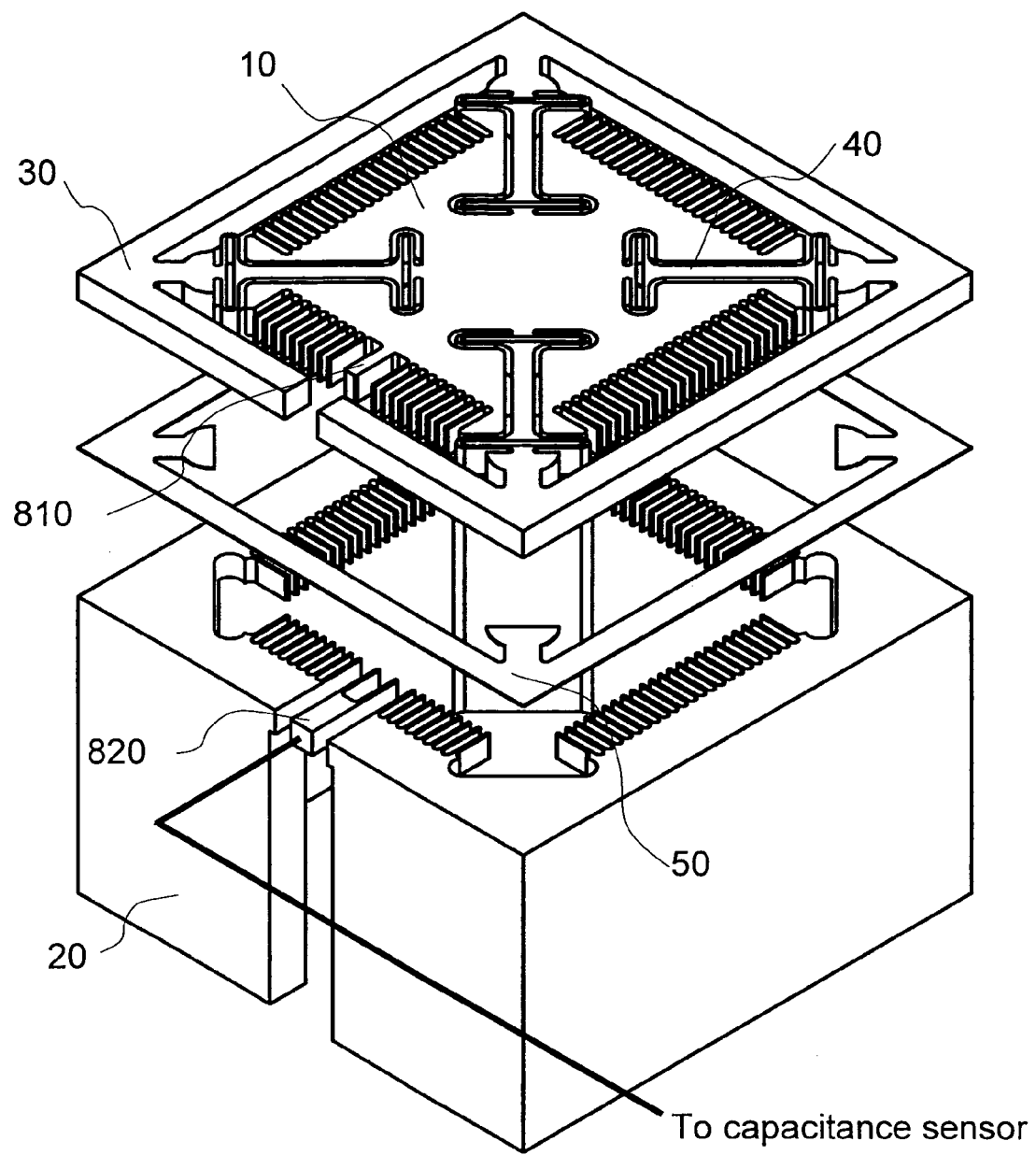
FIG. 17A is an exploded view of an individual actuator module constructed and operative in accordance with certain embodiments of the present invention in which some of the teeth of the moving comb element and of a third, stationary comb element serve as moving and stationary components, respectively, of the capacitance sensor, the moving comb element being disposed within the same layer as the second, stationary comb element.

Reference is now made to FIG. 17A which is an exploded view of an individual actuator module constructed and operative in accordance with certain embodiments of the present invention. As shown, tooth or teeth 810 on the vibrating comb element 10 engage a subset 820 of the teeth of static comb 20 which are dedicated to providing measurements of capacitance, and are electrically connected to a suitable capacitance sensor and to a feedback circuit (not shown) governing the voltage supplied to the comb elements. The subset 820 is electrically insulated from the remaining teeth of static comb 20. It is appreciated that the total active perimeter capable of generating electrostatic force is reduced compared to the total active perimeter of FIG. 1A due the fact that in FIG. 17A, a portion of the perimeter is dedicated to sensing rather than to generating force.

Figure 17B:
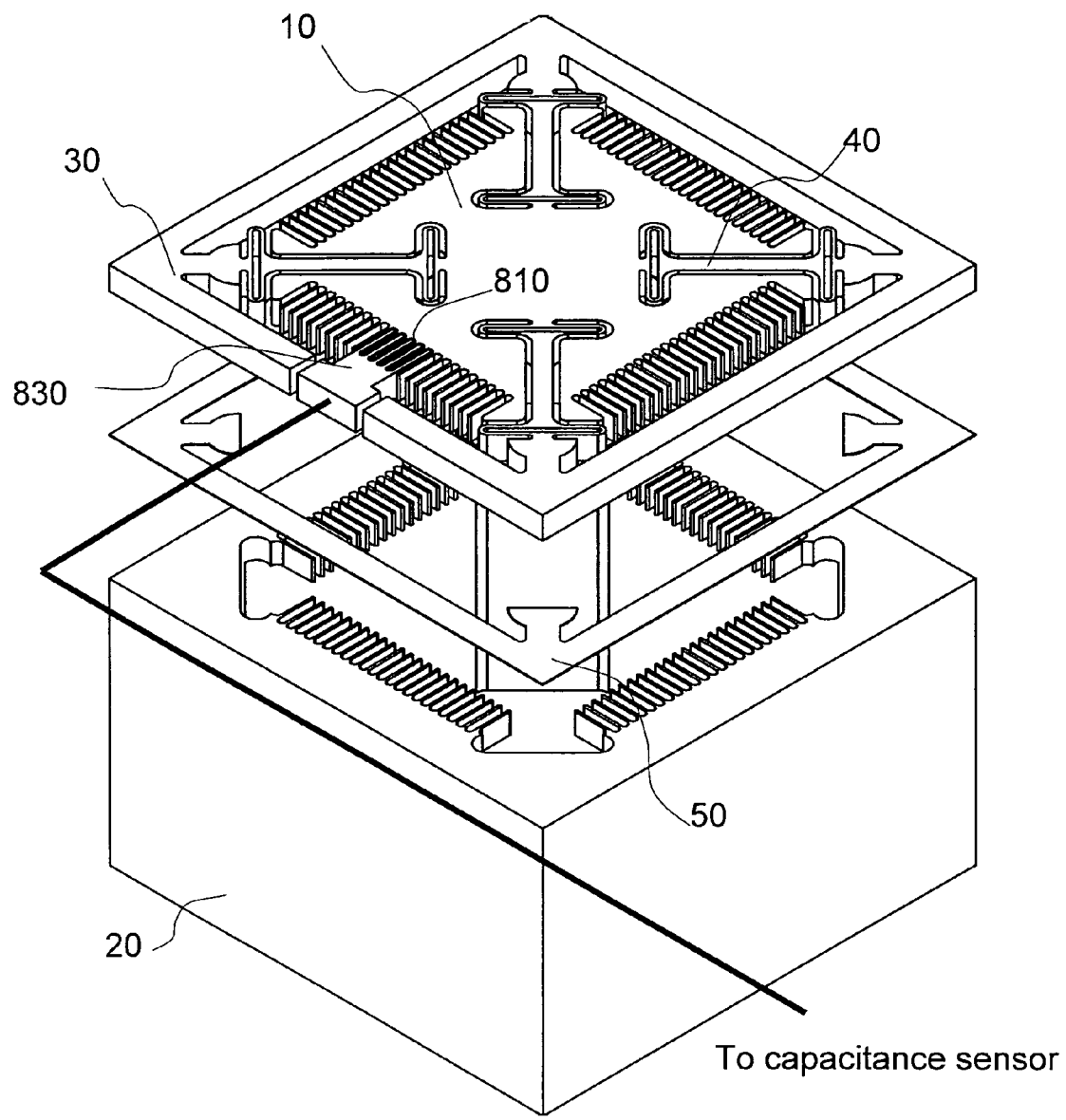
FIG. 17B is an exploded view of an individual actuator module constructed and operative in accordance with certain embodiments of the present invention in which some of the teeth of the moving comb element and of a third, stationary comb element serve as moving and stationary components, respectively, of the capacitance sensor, the first and third comb elements being disposed on the same layer.

Reference is now made to FIG. 17B which is an exploded view of an individual actuator module constructed and operative in accordance with another embodiment of the present invention. In the embodiment of FIG. 17B, a portion 830 of the frame 30 serves as a static component of the capacitance sensor, in contrast to the embodiment of FIG. 17A, in which some of the static comb teeth are used for this purpose. It is appreciated that in the embodiment of FIG. 17A the capacitance measured by the capacitance sensor is proportional to the displacement of the vibrating comb element 10, whereas in the embodiment of FIG. 17B, the capacitance measured by the capacitance sensor is inversely proportional to the displacement of the vibrating comb element 10.

Figure 18:
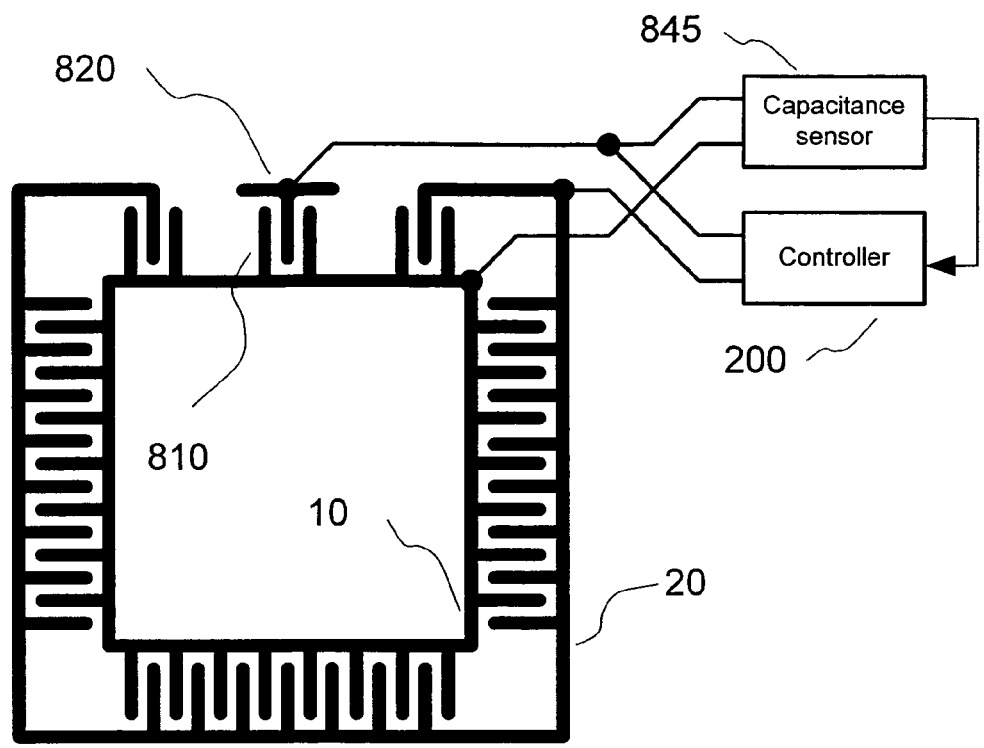
FIG. 18 is a simplified electrical diagram of the apparatus of FIG. 17A.

Reference is now made to FIG. 18 which is a simplified electrical diagram of the apparatus of FIG. 17A. The driving voltage generated by controller 200 is applied between the comb elements 10 and 20. As comb element 10 moves, the capacitance between interlaced teeth 810 and 820 varies essentially linearly hence may be measured, indirectly, by e.g. applying a voltage, generated by the feedback circuit 845, between vibrating comb element 10 and measuring teeth 820 and measuring the current through the feedback circuit 845.

Figure 19:
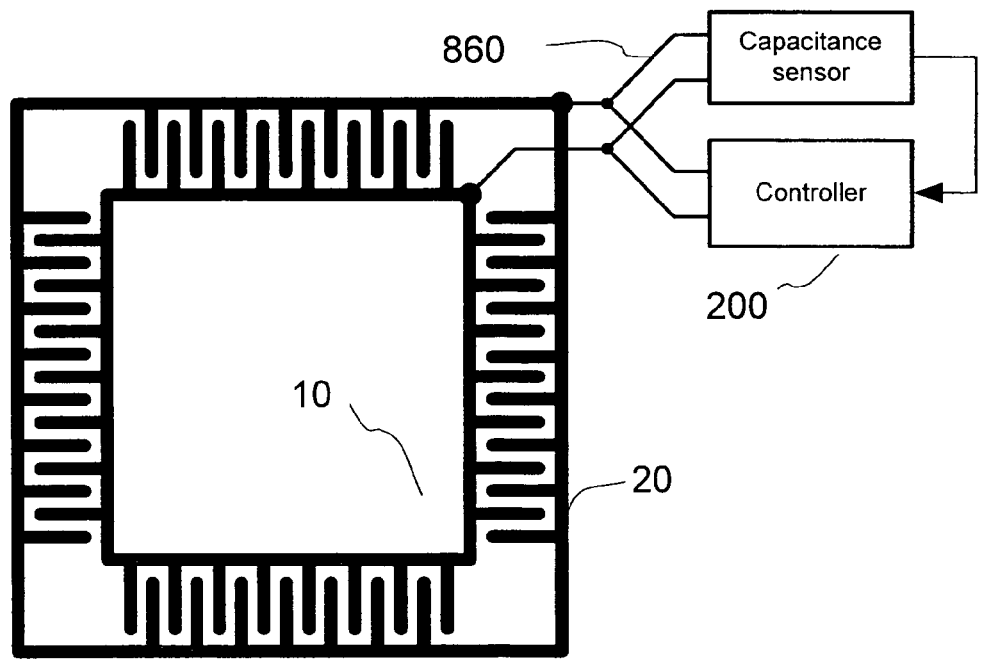
FIG. 19 is a simplified electrical diagram constituting an alternative to the apparatus of FIG. 18 which acquires displacement feedback information differently.

FIG. 19 is a simplified electrical diagram constituting an alternative to the apparatus of FIG. 18 which acquires displacement feedback information differently. In the embodiment of FIG. 19, driving and measurement voltages are both applied, simultaneously, between comb elements 10 and 20. The measurement voltage is selected to be significantly different from the driving voltage. For example, the measurement voltage may have a much higher frequency, such as a frequency an order of magnitude higher than the sampling frequency. Indirect measurement of comb element 10 displacement is effected by measuring high-frequency current through the feedback circuit this current is inversely proportional to the capacitance hence is a suitable indirect measure of displacement.

Alternatively, driving and feedback circuits may be compounded together such that output voltage of the resulting united circuit is a mathematical sum of the driving voltage used and a high-frequency low-voltage component and is applied between the comb elements 10 and 20. The movement pattern of vibrating comb element 10 is practically indifferent toward the high-frequency low voltage component. Measuring the high frequency current component makes it possible to obtain the capacitance value hence indirectly measure displacement.

Figure 20:
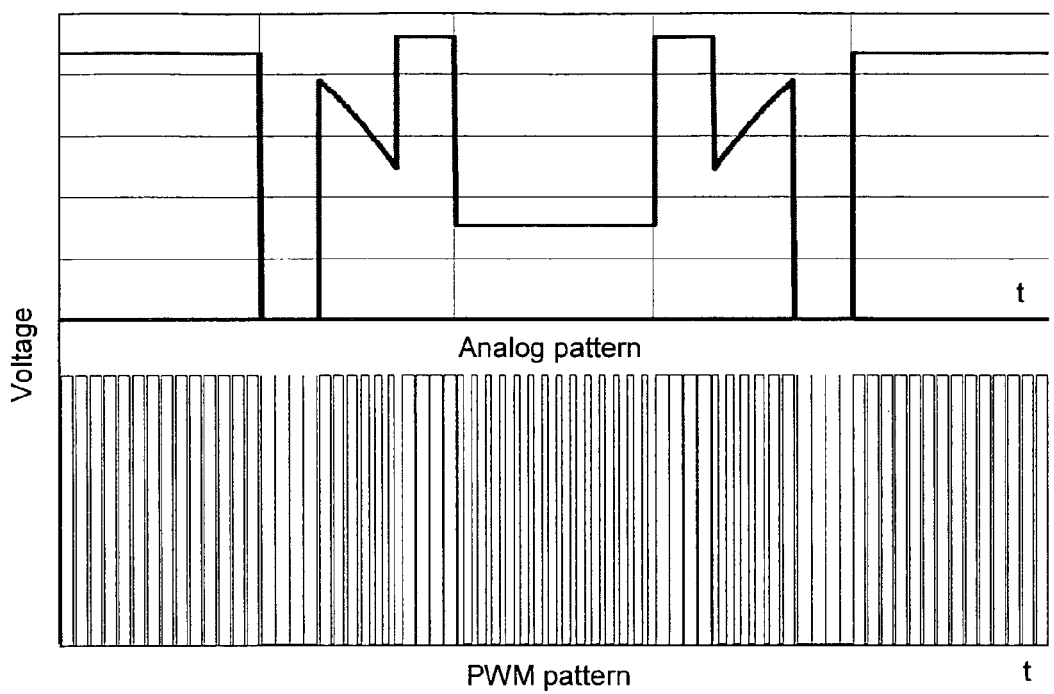
FIG. 20 is an applied voltage vs. time graph for the vibrating comb element of FIG. 1A, using an analog and an equivalent PWM pattern, in accordance with certain embodiments of the present invention.

FIG. 20 includes a voltage vs. time graph (top) constructed in accordance with certain embodiments of the present invention which employ analog voltage generation and a voltage vs. time graph (bottom) constructed in accordance with certain other embodiments of the present invention which employ a PWM pattern of voltage generation. In the top graph, to implement a particular voltage vs. time function, conventional analog voltage generation is used. In the bottom graph, Pulse Width Modulation (PWM) is employed. The instant duty cycle is typically substantially equal to the ratio between the instant voltage as determined by the application, and between the maximal voltage level.

Figure 21:
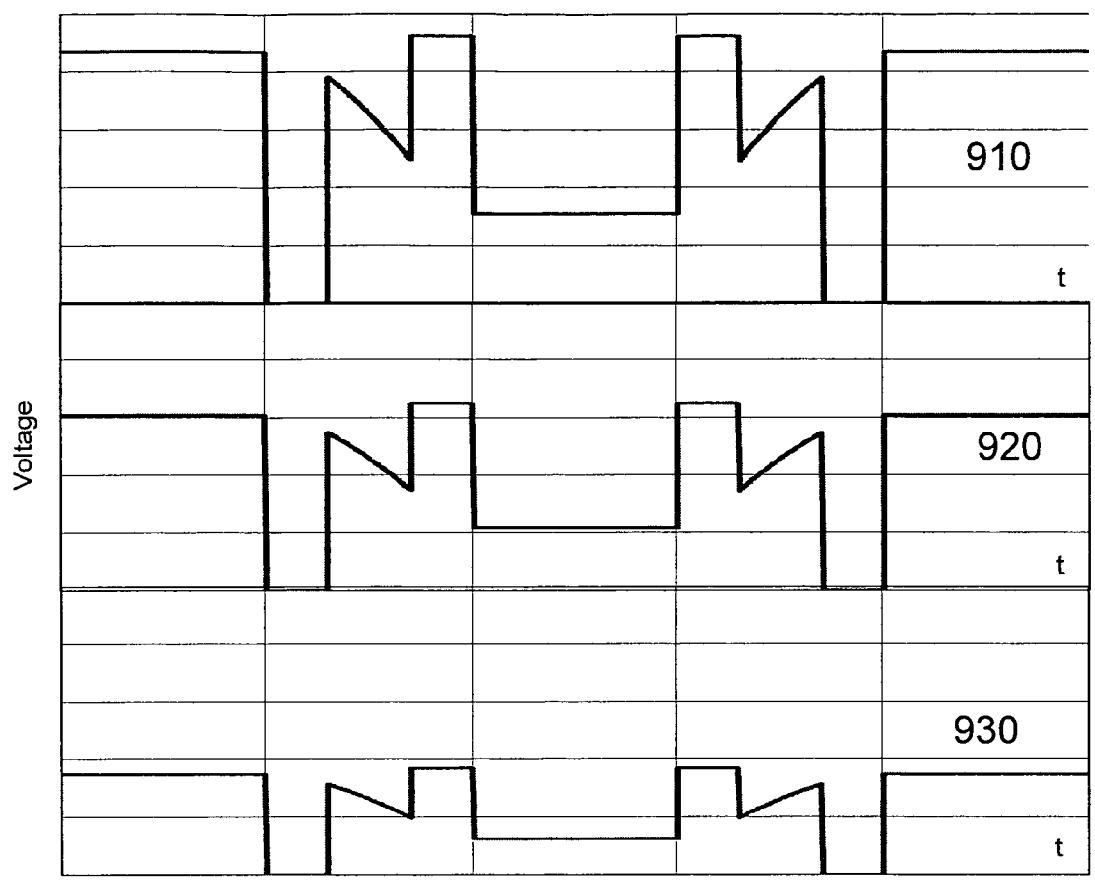
FIG. 21 is a triplet of voltage vs. time graphs, for different volume levels.

FIG. 21 is a triplet of voltage vs. time graphs, for different volume levels. Generally, to control the sound volume level of the system shown and described herein, the applied voltage vs. time function may be instantly multiplied by any desirable factor between 0 and 1. Voltage vs. time graph 910 illustrates a maximal volume level. Voltage vs. time graph 920 illustrates an "average" volume level of about 70%), and voltage vs. time graph 930 illustrates a low volume level of about 40%.

Figure 22A:
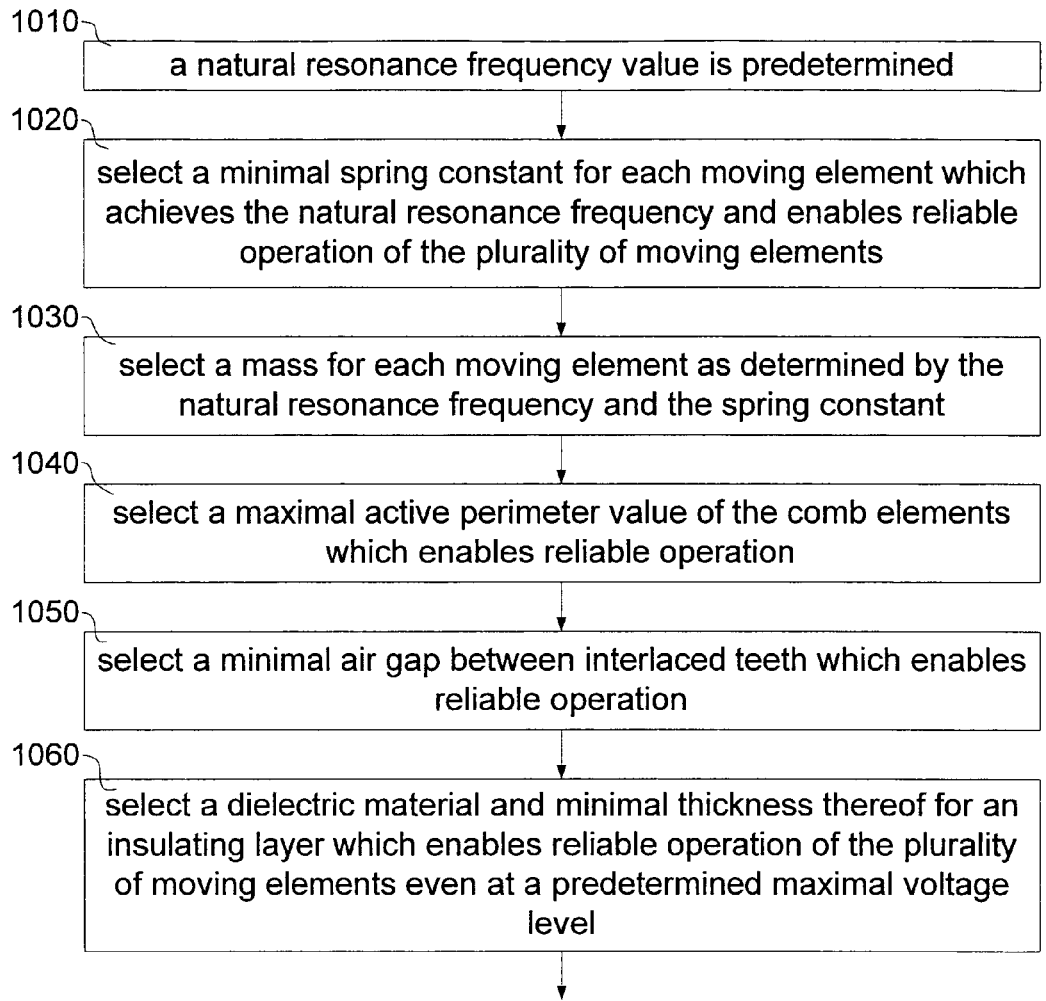
FIG. 22A and FIG. 22B, taken together, form a simplified flowchart illustration of a method for fabricating and operating sound apparatus in accordance with certain embodiments of the present invention.
Figure 22B:
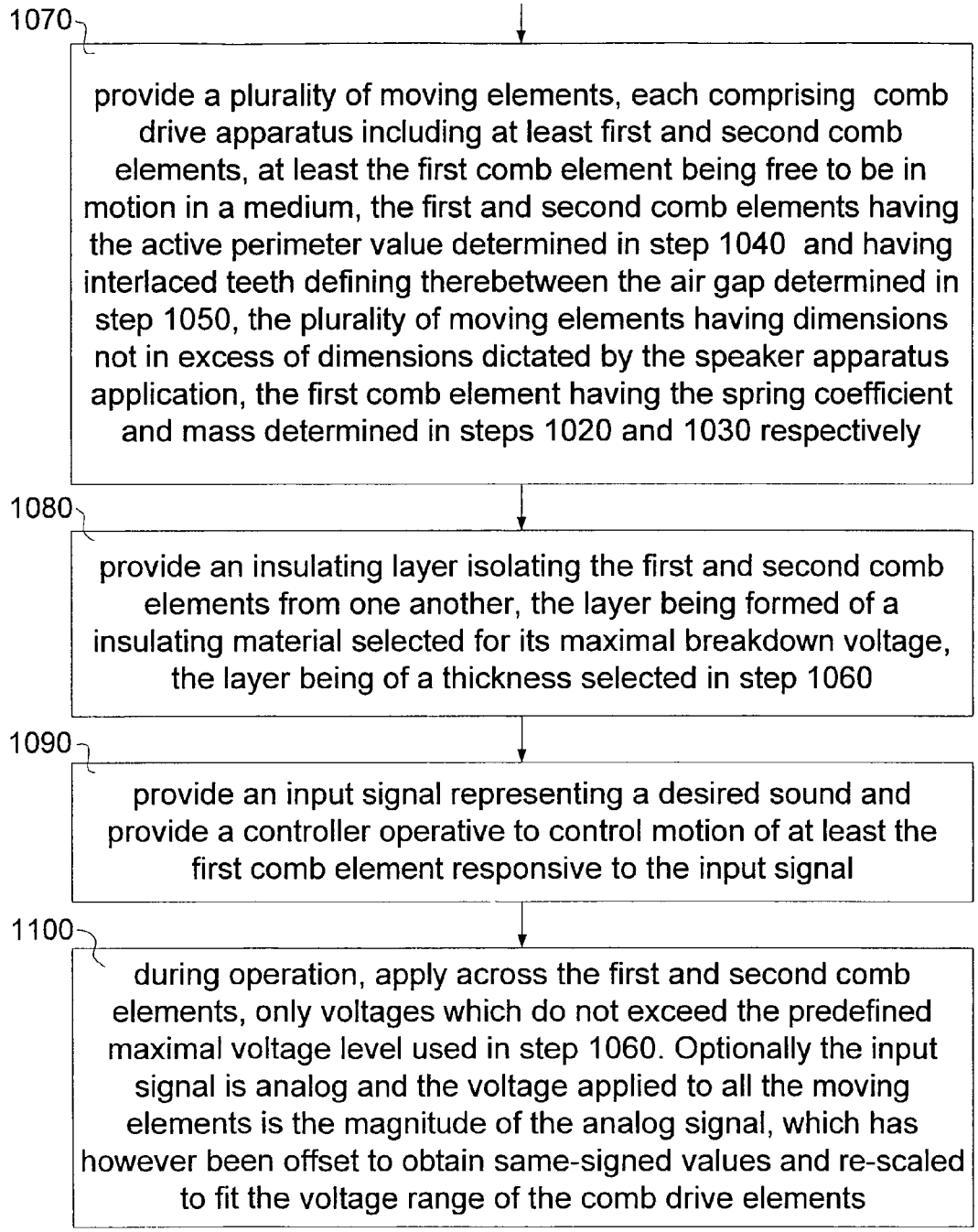

FIG. 22A and FIG. 22B, taken together, form a simplified flowchart illustration of a method for fabricating and operating sound apparatus in accordance with certain embodiments of the present invention. The method of FIGS. 22A-22B typically includes some or all of the following steps, suitably ordered e.g. as shown:

In step 1010, a natural resonance frequency value is predetermined

In step 1020, select a minimal spring constant for each moving element which achieves the natural resonance frequency and enables reliable operation of the plurality of moving elements.

In step 1030, select a mass for each moving element as determined by the natural resonance frequency and the spring constant.

In step 1040, select a maximal active perimeter value of the comb elements which enables reliable operation.

In step 1050, select a minimal air gap between interlaced teeth which enables reliable operation.

In step 1060, select a minimal thickness for an insulating layer which enables reliable operation of the plurality of moving elements even at a predetermined maximal voltage level.

In step 1070, provide a plurality of moving elements, each comprising comb drive apparatus including at least first and second comb elements, at least the first comb element being free to be in motion in a medium, the first and second comb elements having the active perimeter value determined in step 1040 and having interlaced teeth defining therebetween the air gap determined in step 1050, the plurality of moving elements having dimensions not in excess of dimensions dictated by the speaker apparatus application, the first comb element having the spring coefficient and mass determined in steps 1020 and 1030 respectively.

In step 1080, provide an insulating layer isolating the first and second comb elements from one another, the layer being formed of a insulating material selected for its maximal breakdown voltage, the layer being of a thickness selected in step 1060.

In step 1090, provide an input signal representing a desired sound and provide a controller operative to control motion of at least the first comb element responsive to the input signal.

Step 1100: During operation, apply across the first and second comb elements, only voltages which do not exceed the predefined maximal voltage level used in step 1060. Optionally the input signal is analog and the voltage applied to all the moving elements is the magnitude of the analog signal, which has however been offset to obtain same-signed values and re-scaled to fit the voltage range of the comb drive elements.

Features of the present invention which are described in the context of separate embodiments may also be provided in combination in a single embodiment. Conversely, features of the invention, including method steps, which are described for brevity in the context of a single embodiment or in a certain order may be provided separately or in any suitable sub-combination or in a different order. "e.g." is used herein in the sense of a specific example which is not intended to be limiting.

The invention claimed is:

1. An actuation method comprising:
   providing at least one actuator element, each actuator element comprising a comb drive apparatus including a central comb element and a peripheral comb element, the peripheral comb element being disposed peripherally of said central comb element and being free to be in motion in a medium; and providing at least one flexure that is disposed peripherally outward of said peripheral comb element and from which said peripheral comb element is suspended.

2. An Actuator apparatus comprising:

at least one actuator element, each actuator element comprising a comb drive apparatus including:

a central comb element;

a peripheral comb element that is disposed peripherally of said central comb element and that is free to be in motion in a medium; and at least one flexure that is disposed peripherally outward of said peripheral comb element and from which said peripheral comb element is suspended.

3. The actuator apparatus according to claim 2 which is operative to generate sound, the actuator apparatus also comprising a controller configured to control motion responsive to an input signal representing a desired sound.

* * * * *